(12) United States Patent
Dejneka et al.

(10) Patent No.: US 6,324,326 B1
(45) Date of Patent: Nov. 27, 2001

(54) TAPERED FIBER LASER

(75) Inventors: Matthew J. Dejneka, Corning; John D. Minelly; Luis A. Zenteno, both of Painted Post, all of NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 09/378,770

(22) Filed: Aug. 20, 1999

(51) Int. Cl.$^7$ .................. G02B 6/16; H01S 3/067
(52) U.S. Cl. .................. 385/123; 385/33; 385/43; 372/6; 359/341.1
(58) Field of Search ................. 372/6; 359/333, 359/341–343; 385/28, 29, 33–36, 43, 123, 124, 129, 141, 142

(56) References Cited

U.S. PATENT DOCUMENTS

| | | | |
|---|---|---|---|
| 4,161,944 | * 7/1979 | Muckerheide | 359/341 X |
| 4,179,187 | 12/1979 | Maurer . | |
| 4,212,660 | 7/1980 | Maurer . | |
| 4,705,351 | 11/1987 | Toda . | |
| 4,886,538 | 12/1989 | Mahapatra et al. . | |
| 4,901,324 | 2/1990 | Miller et al. . | |
| 4,941,726 | 7/1990 | Russell et al. . | |
| 5,119,460 | * 6/1992 | Bruce et al. | 385/142 |
| 5,166,940 | 11/1992 | Tumminelli et al. . | |
| 5,265,177 | * 11/1993 | Cho et al. | 385/28 X |
| 5,422,897 | 6/1995 | Wyatt et al. . | |
| 5,455,879 | 10/1995 | Modavis et al. . | |
| 5,530,710 | 6/1996 | Grubb . | |
| 5,659,644 | 8/1997 | DiGiovanni et al. . | |
| 5,710,789 | 1/1998 | Mackechnie et al. . | |
| 5,774,484 | 6/1998 | Wyatt et al. . | |
| 5,864,644 | 1/1999 | DiGiovanni et al. . | |
| 5,940,557 | * 8/1999 | Harker | 385/33 |

FOREIGN PATENT DOCUMENTS

| | | |
|---|---|---|
| 0 802592 A2 | 9/1997 | (EP) . |
| WO 98/44361 | 10/1998 | (WO) . |

OTHER PUBLICATIONS

"Loss Analysis of Single–Mode Fiber Splices"; The Bell System Technical Journal; D. Marcuse; Feb. 1985; pp 703–718.

"Ring–doped cladding–pumped single–mode three–level fiber laser"; Optics Letters; Nilsson, et al; Mar. 1, 1998; vol. 23, No. 5; pp 355–357.

"Tapered–Beam Expander for Single–Mode Optical–Fibre Gap Devices"; Electronics Letters; Jedrzejewski et al; Jan. 16, 1986; vol. 22, No. 2; pp. 105–106.

(List continued on next page.)

Primary Examiner—John D. Lee
(74) Attorney, Agent, or Firm—Juliana Agon

(57) ABSTRACT

A tapered fiber laser having a multi-mode section, a single-mode section, and either a tapered section or fundamental mode matching junction therebetween. The multi-mode section has a large core to directly receive pump light from a broad stripe laser or diode bar, and a length preferably longer than the absorption length of the pump light (so optical amplification occurs predominantly in the multi-mode section). Doping levels can be increased to reduce the multi-mode length. The taper angle is sufficiently small to produce adiabatic compression of the fundamental mode from the multi-mode to single-mode sections, and acts as a cutoff filter favoring lasing of the fundamental mode within the multi-mode section. Alternately, the step junction may have a mode field diameter matched to the lowest-order mode, with laser light output via the single-mode section. The invention can be applied to waveguides (particularly those having an aspect ratio corresponding to a broad stripe laser source), doped with ytterbium or neodymium ions, and is particularly advantageous as a pump source for an erbium-doped fiber amplifier (EDFA).

7 Claims, 14 Drawing Sheets

OTHER PUBLICATIONS

"Single–Mode Fibre Y–Junction Beam–Splitter"; Electronics Letters; Minelly et al; Sep. 24, 1987; vol. 23, No. 20; pp 1087–1088.

"Asymmetric Multimode Couplers"; Journal of Lightwave Technology; Griffin et al; Nov. 1991; vol. 9, No. 11; pp 1508–1517.

* cited by examiner

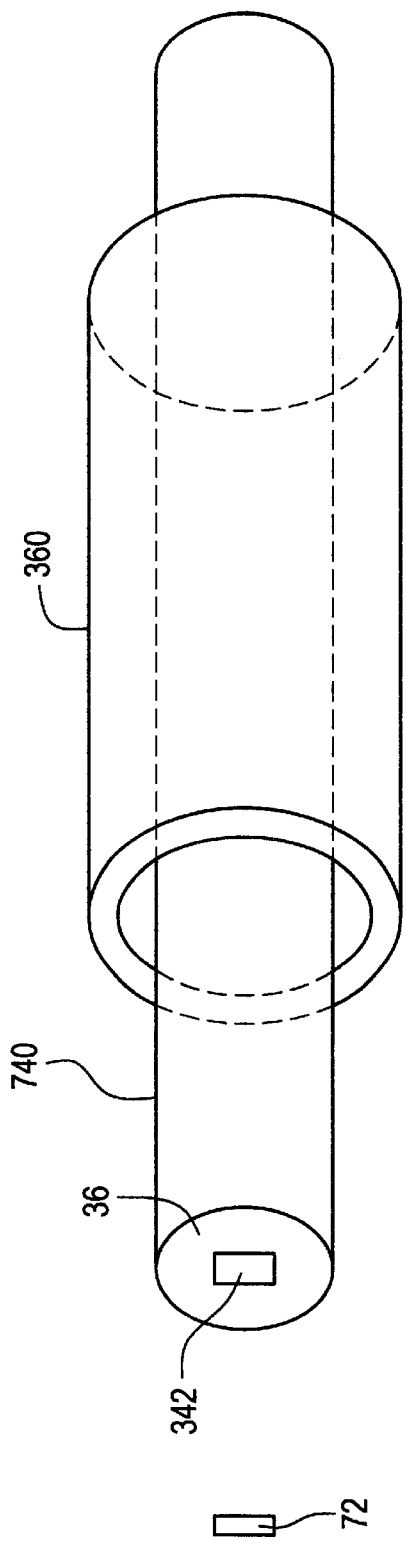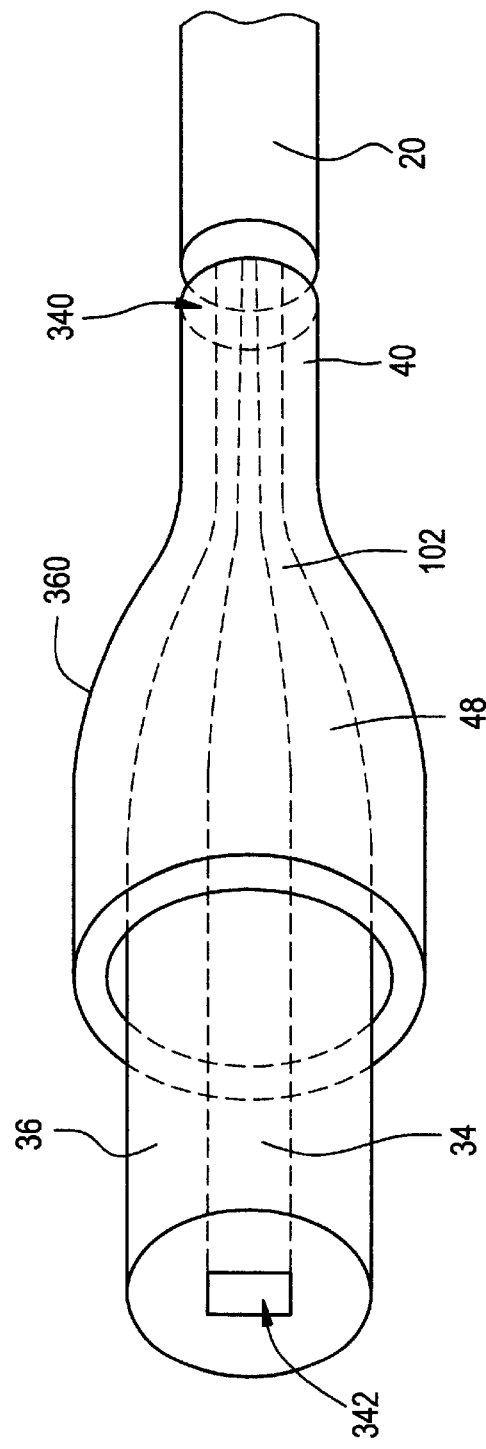

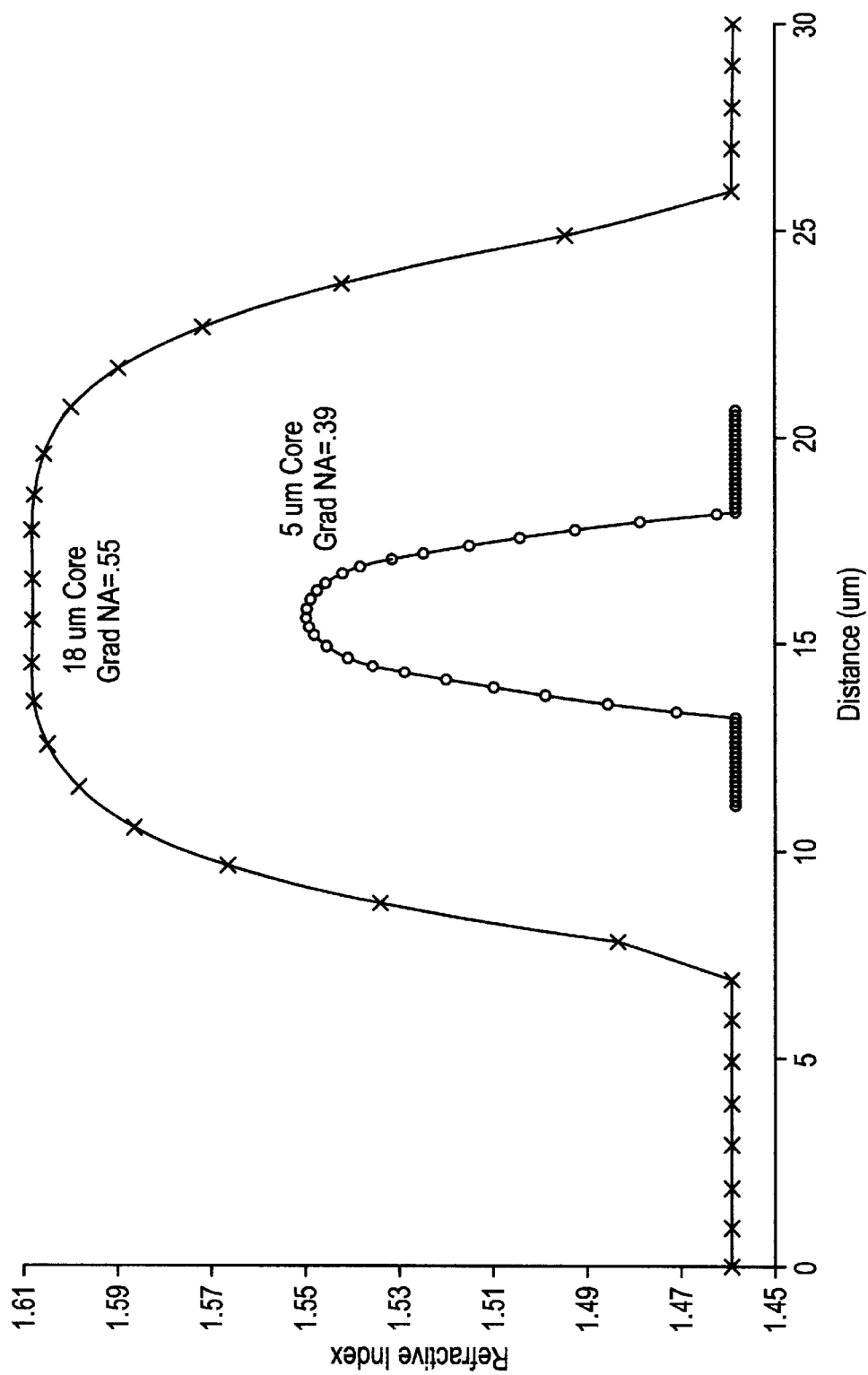

TAPERED FIBER LASER

BACKGROUND OF THE INVENTION

1. Field of the Invention

The present invention relates generally to optical amplifiers and lasers, and in particular to fiber lasers.

2. Technical Background

Optical fiber is increasingly becoming the favored transmission medium for telecommunications due to its high capacity and immunity to electrical noise. Silica optical fiber is relatively inexpensive, and when fabricated as a single-mode fiber can transmit signals in the 1550 nm band for many kilometers without amplification or regeneration. However, a need still exists for optical amplification in many fiber networks, either because of the great transmission distances involved, or the optical signal being split into many paths.

Erbium-doped fiber amplifiers (EDFAs) have been found quite effective in providing the required optical gain. As illustrated schematically in FIG. 1, a conventional EDFA is interposed between an input transmission fiber and an output transmission fiber 14. Both transmission fibers 12, 14 need to be single-mode, because higher-order modes exhibit much greater dispersion (typically the limiting factor for the fiber transmission distance at high data rates). The EDFA includes a length (on the order of tens of meters) of an erbium-doped silica fiber 16, as is well known in the art. The doped fiber 16 should also be single-mode in order to maintain the transmission signal integrity. The doped fiber 16 is optically active due to the presence of $Er^{3+}$ ions, which can be excited to higher electronic energy levels when the doped fiber 16 is pumped by a strong collinearly-propagating optical pump signal. Typically, an optical pump source 18 inputs the pump signal into the doped fiber 16 through a pump source fiber 20 coupled to either the undoped upstream fiber or the doped fiber 16 through a wavelength-selective directional coupler 22, but downstream coupling is also known. Again, for integrity of the transmission signal, the pump source fiber 20 should be single-mode. An operative EDFA may contain some additional elements (such as an isolator) which are well known to the art but not relevant to the understanding of the background of the present invention.

Conventionally, one typical pump source 18 has been an edge-emitting semiconductor laser that includes a waveguide structure (in what is called a "stripe" structure) that can be aligned with the single-mode pump source fiber 20 to provide effective power coupling. However, this approach has failed to keep up with modern fiber transmission systems incorporating wavelength-division multiplexing (WDM). In one approach to WDM, a number of independent lasers inject separately-modulated optical carrier signals of slightly different wavelengths into the transmission fiber 12. The EDFA has sufficient bandwidth to amplify carrier signals within about a 40 nm bandwidth. A large number of multiplexed signals to be amplified require in aggregate a proportionately large amount of pump power. Over the past decade, the number of WDM channels preferably utilized in a standard network has increased from about four to current levels of forty or more, but at best the output power from a single-stripe laser source has only doubled. Derivative designs such as a master oscillator power amplifier (a single-mode stripe followed by a broad stripe amplifier) or flared-semiconductor devices are capable of producing more than one watt of optical output power, but many of these designs have been subject to reliability problems (such as back-facet damage caused by feedback) that have hindered their practical deployment as fiber amplifier pumps.

Another approach uses WDM technology to combine pump signals. Multiple single-stripe lasers are designed to emit light at narrowly-spaced wavelengths, usually within the wavelength bands of 970–990 nm or 1460–1500 nm. Wavelength-dependent directional couplers combine these multiple optical waves into a single (somewhat broadband) pump signal. While this approach increases the power available for optical amplifiers, it greatly adds to the complexity of the pump source, and requires additional components such as thermoelectric coolers, fiber gratings, and directional couplers. As a result, this approach increases cost.

An alternative approach for high-power pump lasers has involved fiber lasers that are pumped through their cladding. That is, a large outer cladding supports the pump signal from a primary pump source, and an inner cladding supports a single-mode output signal that is used as the secondary pump source for the EDFA. The core is typically doped to provide lasing capability. Typically, a neodymium- or ytterbium-doped double-clad fiber is pumped with a high-power diode optical source (at 800 nm or 915 nm) to produce a single transverse mode (at 1060 nm or 1120 nm, respectively). One of these modes then pumps a cascaded Raman laser to convert the wavelength to around 1480 nm, which can then pump erbium. To date, such a design by itself (that is, without an additional Raman oscillator) does not produce an output in any of the appropriate absorption bands for EDFAs.

Double-clad fiber lasers offer superior performance for four-level lasing (that is, where the lasing occurs in a transition between two excited states). In such a case, the doped core is still transparent at the laser signal wavelength when not being pumped. As a result, the power threshold for lasing depends essentially on the dimensions of the doped core, and the background loss in the fiber over the pump absorption length. However, ytterbium and neodymium ions ($Yb^{+3}$ and $Nd^{+3}$) provide three-level lasing systems at around 980 nm and 940 nm, respectively. In a three-level system, the lasing occurs from an excited level to either the ground state or a state separated from it by no more than a few kT (that is, thermally mixed at operating temperature). As a result, an unpumped doped core strongly absorbs at the laser wavelength, and the lasing power threshold can become a problem.

Ytterbium has offered much promise as a pump for high-powered EDFAs. It is well known that $Yb^{3+}$ ions exhibit gain in a narrow 6 nm-wide three-level transition at 976 nm, and in a broad quasi-three-level transition peaked at 1030 nm (but extending as far as 1140 nm). The latter transition requires a population inversion of only a few percent for transparency, while the former requires at least a fifty-percent inversion.

Thus, a source based on the 976 nm $Yb^{+3}$ transition has long been suggested as a pump for EDFAs. However, a single-stripe diode laser remains the most efficient pump structure. The problem potentially lies in the relationship between the gains in the two transitions and the pump absorption. As a representative example, the gains at the two wavelengths in Yb-doped germano-alumino-silicate glass (assuming homogeneous broadening) are related by the equation:

$$G_{1030} = 0.25 G_{976} + 0.74 \alpha_P \frac{\Gamma_S}{\Gamma_P} \qquad (1)$$

where $G_{1030}$ and $G_{976}$ are the gains at 1030 nm and 976 nm, respectively, $\alpha p$ is the partially-bleached absorption in decibels (dB), and $\Gamma_S$ and $\Gamma_P$ are the respective overlap factors of the signal mode and pump mode with the dopant profile.

Double-clad fibers allow coupling from diode bars and other similar active structures. However, this is accomplished by a greatly-reduced pump overlap with the doping profile relative to the signal overlap, since the doping needs to be confined in or close to the signal core in order to obtain sufficient optical gain for the core mode at the signal wavelength. Typically, the core is uniformly doped, and the area ratio between the pump waveguide and the signal core is on the order of 100:1. As a result, $\Gamma_S \approx 1$ and $\Gamma_P < 0.01$. Using these values in Equation (1), each 1 dB of pump absorption produces about 74 dB of gain at 1030 nm. Even with weak pumping, amplified spontaneous emission (ASE) at 1030 nm will saturate the amplifier and prevent a buildup of the population inversion necessary for lasing at 976 nm. In fact, even without an optical cavity, lasing at the longer four-level wavelengths is possible from the backscatter. Hence, high pump absorption will favor gain at 1030 nm or longer even if the laser mirrors are tailored to 976 nm.

If the fiber laser uses a single-clad fiber with both the pump and lasing signal confined to the one core, the ratio of the two overlap functions approaches unity, and the 976 nm transition can be selected simply by limiting the fiber length so that insufficient gain exists for lasing at 1030 nm and longer. For a typical fiber laser with a round-trip end loss of about 14 dB (due to four percent reflectance at the cleaved output facet), 15 dB of pump absorption will cause the 976 nm transition to lase, but not the 1030 nm transition. However, this solution does not address the need to produce high output power into a single-mode fiber.

It is thus desirable to find a more efficient method of pumping the 976 nm transition in an ytterbium-doped fiber amplifier.

SUMMARY OF THE INVENTION

The present invention may be summarized as a fiber (or other dielectric waveguide) laser pumpable by a diode laser of potentially large size. The fiber laser includes an optical fiber doped with an ion such as neodymium ($Nd^{3+}$) or ytterbium ($Yb^{3+}$) which can be optically pumped. The optical fiber includes a first section receiving the pump light and being multi-mode to the resultant lasing radiation. The multi-mode first section is connected to a second section having a core of decreasing diameter extending away from the first section so as to adiabatically decrease the fundamental mode spot size. The second section may be connected to a single-mode fiber to output the lasing light. Because the fundamental mode spot size of the multi-mode fiber or of the first section is not the same as the fundamental mode spot size of the single-mode fiber or of the second section, mode transformation occurs and is taught by the present invention.

Alternatively, the tapered section can be replaced (in full or in part) by a junction between two fibers forming the multi-mode and single-mode sections, both designed to provide equal diameters for the lowest-order mode at the junction.

The invention also applies these same concepts to other shapes of dielectric waveguides, whether freestanding or formed on a substrate. A representative example is a rectangular planar waveguide with an aspect ratio matching that of the diode laser pumping the laser.

The invention is particularly advantageous when used as a pump source for an erbium-doped fiber amplifier (EDFA), such as may be found in single-mode fiber optic communication networks or systems.

BRIEF DESCRIPTION OF THE DRAWINGS

FIG. 12 is a representation of the formation of the tapered mode converter 30 of FIG. 10 by provision of a multi-mode fiber into a tube before the taper is formed, according to the present invention;

FIG. 13 is a representation of the formation of the tapered mode converter 30 of FIG. 10 by heating and diffusing the multi-mode fiber and the tube outside to form the taper, according to the present invention;

FIG. 14 is a graph of the index profile of the fiber before and after tapering, showing how the heating, tapering, and diffusing lowers the peak index and lowers the NA, according to the present invention;

Figure 9:
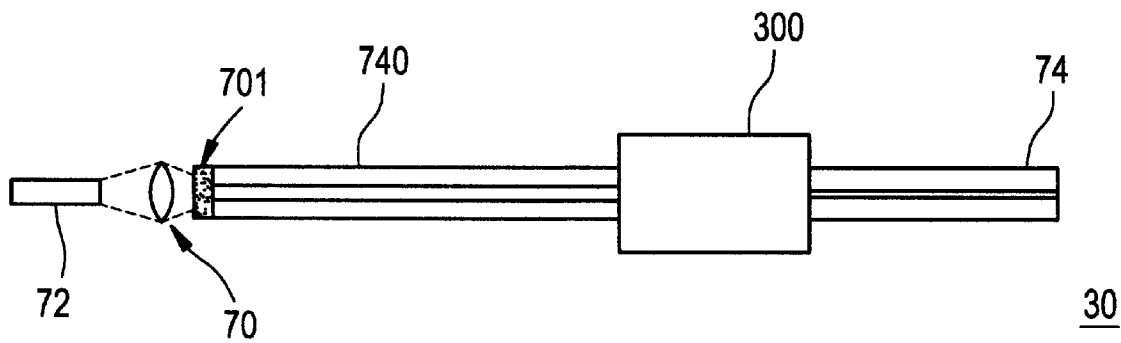
FIG. 9 is a schematic representation of a brightness converter or optical pump source 18 of FIG. 1 according to the present invention.
Figure 10:
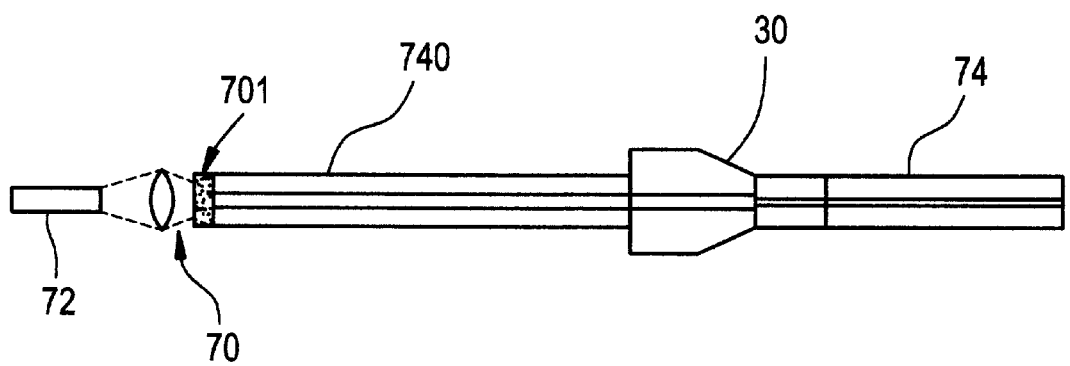
FIG. 10 is a schematic representation of a tapered mode converter 30 used as the mode transformer 300 of FIG. 9 according to the present invention.
Figure 18:
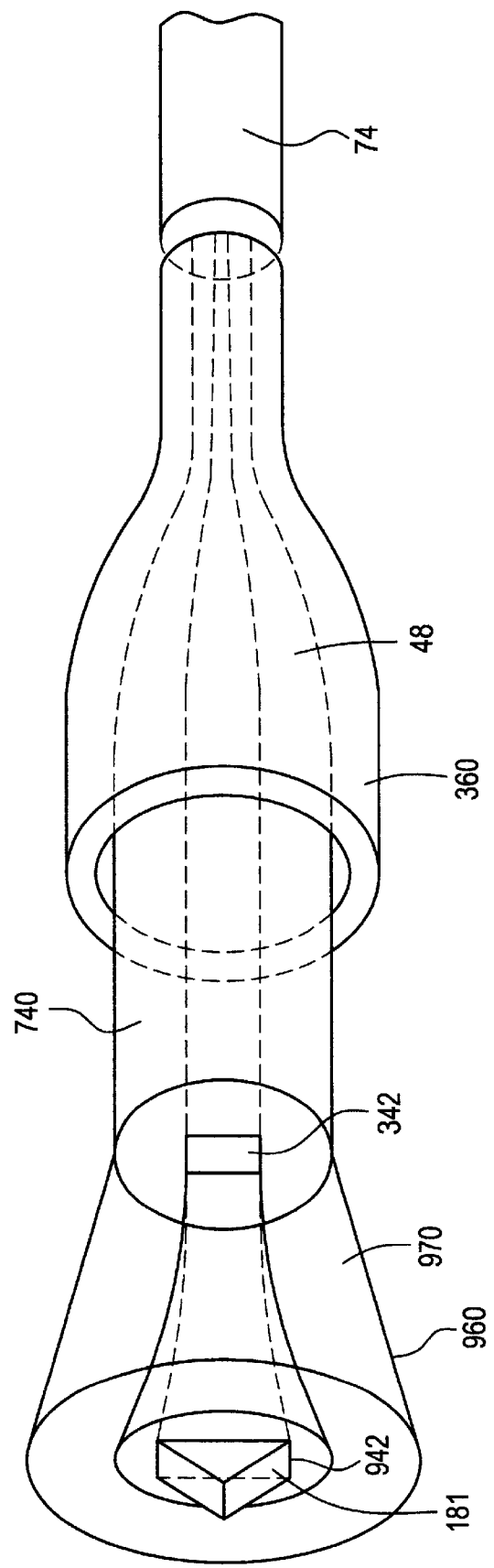
Figure 19:
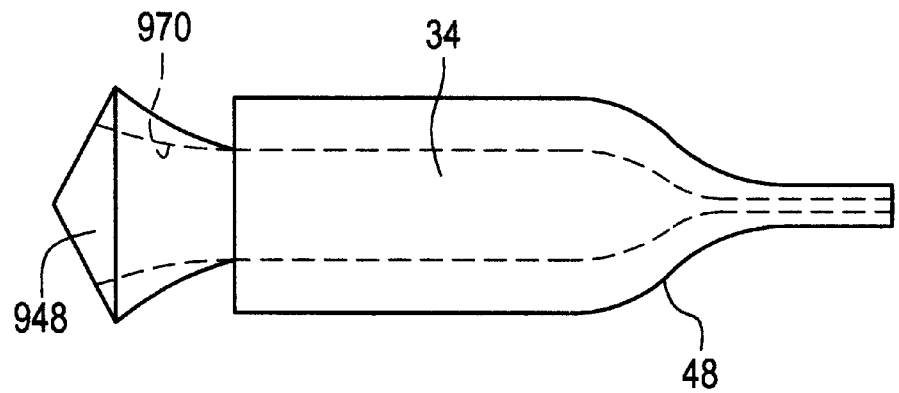
Figure 20:
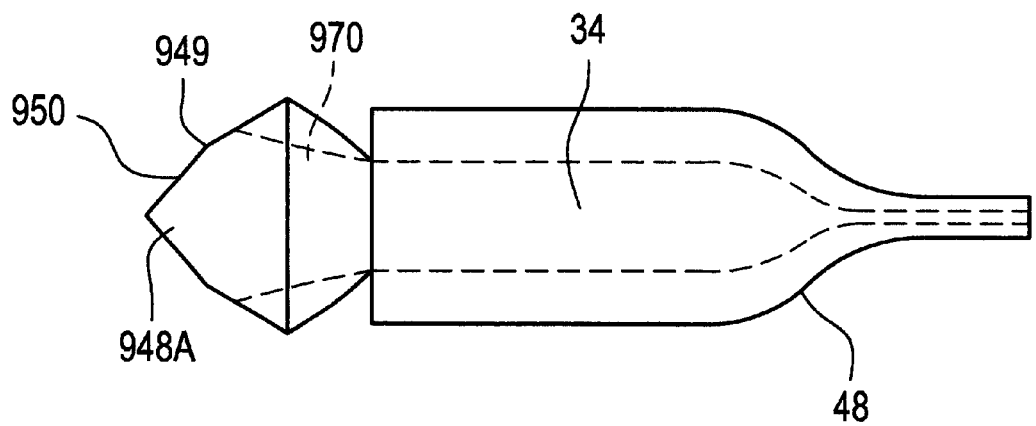
Figure 21:
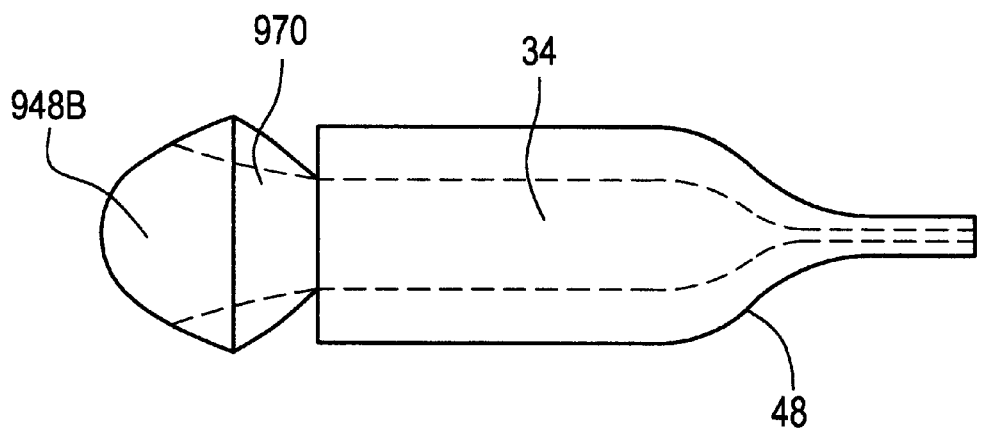

FIG. 18 is a representation of a fiber-optic coupler embodiment of the optical exciter 70 of FIG. 9, used with the mode converter 30 of FIG. 13, according to the present invention;

FIG. 19 is a side view of a planar wedge version of the lens profile, according to the present invention;

FIG. 20 is a side view of a double-wedged version of the lens profile, according to the present invention; and FIG. 21 is a side view of a multiple-wedged version of the lens profile, according to the present invention.

DETAILED DESCRIPTION OF THE PREFERRED EMBODIMENTS

The optically-active fiber, fiber amplifier, fiber laser, or dielectric waveguide laser of the present invention is shown in FIGS. 2 and 4–7, and is generally described and depicted herein with reference to several exemplary or representative embodiments with the same numbers referenced to the same or functionally similar parts.

Figure 1:
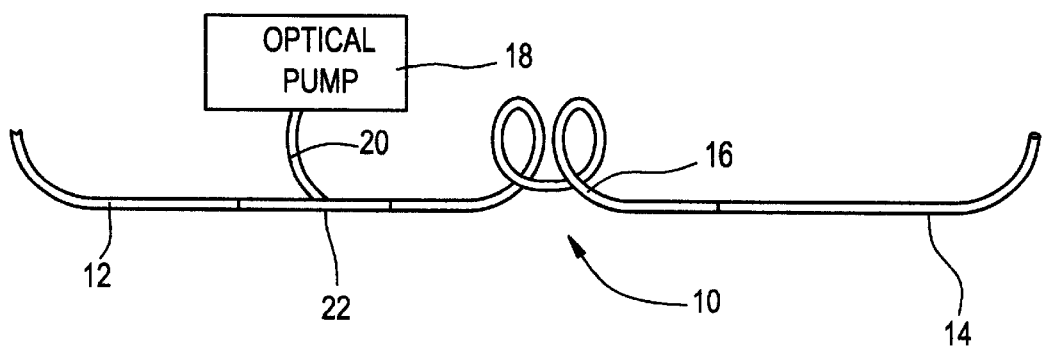
FIG. 1 is a schematic illustration of a prior art erbium-doped fiber amplifier (EDFA) used in a typical fiber optic telecommunications system.

Referring particularly to FIG. 1, erbium-doped fiber amplifiers (EDFAs) are known to the art and are effective in providing the required optical gain within wavelengths operational for telecommunications or digital signal-processing applications. As illustrated schematically in FIG. 1, a conventional EDFA is interposed between an input transmission fiber and an output transmission fiber 14. Both transmission fibers 12 and 14 are preferably single-mode, because higher-order modes exhibit much greater dispersion (typically the limiting factor for the fiber transmission distance at high data rates). The EDFA includes a length (on the order of tens of meters) of an erbium-doped silica fiber 16, as is well known in the art. The doped fiber 16 should preferably also be single-mode, in order to maintain the transmission signal integrity. The doped fiber 16 is optically active due to the presence of $Er^{3+}$ ions or other rare-earth metals, which can be excited to higher electronic energy levels when the doped fiber 16 is pumped by a strong collinearly-propagating optical pump signal. Typically, an optical pump source 18 inputs the pump signal into the doped fiber 16 through a pump source fiber 20 coupled to either the undoped upstream fiber 12 or the doped fiber 16 through a wavelength-selective directional coupler 22, but downstream coupling is also known. Again, for integrity of the transmission signal, the pump source fiber 20 should preferably be single-mode. An operative EDFA may contain some additional elements (not shown) which are well known to the art but not relevant to understanding the background of the present invention.

One typical pump source 18 is an edge-emitting semiconductor laser that includes a waveguide structure (in a "stripe" structure or configuration) that can be aligned with the single-mode pump source fiber 20 to provide effective power coupling.

As suggested above, efficient coupling between a large multi-mode pump source and a single-mode fiber laser can be facilitated according to the present invention by including both single-mode and multi-mode sections within the optical cavity of a fiber laser.

Figure 2:
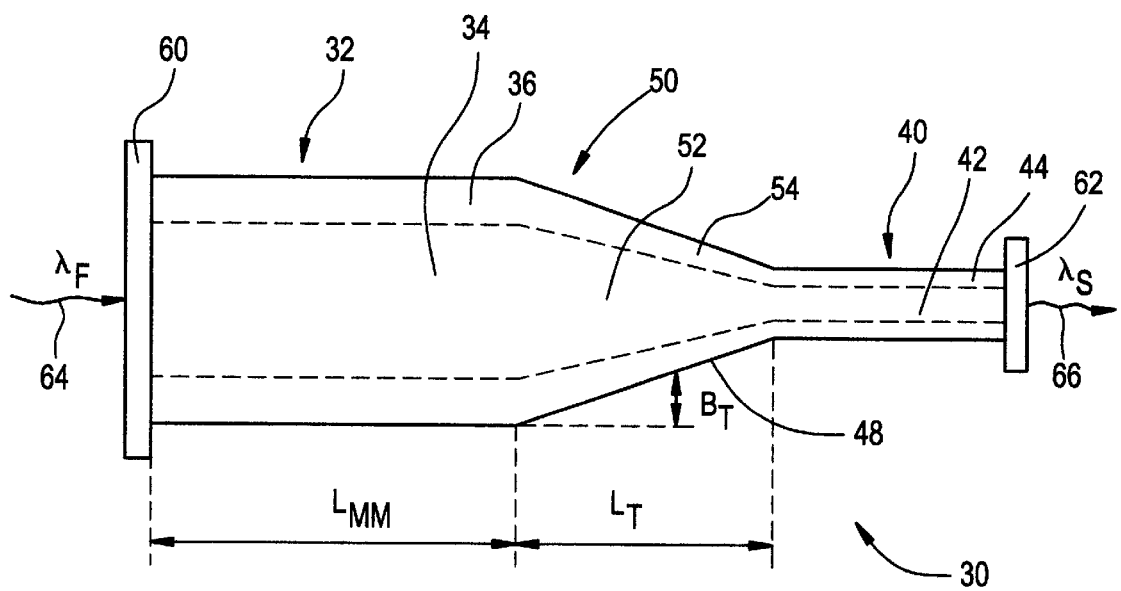
FIG. 2 is a schematic cross-sectional view of a fully tapered fiber laser according to the present invention.

As illustrated in the cross-sectional view of FIG. 2, an input side of a tapered fiber amplifier 30 is irradiated with a pump signal at wavelength $\lambda_P$. The input side includes a length $L_{MM}$ of doped multi-mode fiber 32, preferably for our stated purposes doped with ytterbium ions ($Yb^{3+}$). The multi-mode fiber 32 includes a core 34 and a cladding 36. No attempt has been made to accurately illustrate their relative diameters. Also, it is possible to use air (n=1) as the cladding. The output side includes a length of single-mode fiber 40, also composed of a core 42 and a cladding 44. The single-mode length is relatively unimportant beyond its being very long compared to the wavelengths involved so that any higher-order modes are adequately attenuated over its length. In most circumstances 1 cm of single-mode length is more than adequate. The multi-mode section 32 is joined to the single-mode section 40 through an adiabatically tapered section 48 composed of a core 52 and a cladding 54. The tapered section 48 has a length $L_T$, but a more relevant parameter is a taper angle $\theta_T$ which is of the order of tens of milliradians (½°), as will be discussed later.

As is well known, if a fiber is below a certain diameter it can support only a single transverse mode. Above that diameter, two or more transverse modes are supported. The larger the diameter, the larger the number of modes. For a simple optical fiber having a core of refractive index $n_{core}$ and having a thick cladding of refractive index $n_{clad}$, the maximum core diameter $d_{SM}$ supporting only a single mode is given by the equation:

$$d_{SM} = \frac{2.405\lambda}{\pi\sqrt{n_{core}^2 - n_{clad}^2}} \qquad (2)$$

The relevant wavelength $\lambda$ is that of the lasing light, which is 976 nm for a $Yb^{3+}$-doped fiber. Optical fibers of other designs have more complicated cross sections including additional layers at the core-cladding transition or a continuously graded refractive index across the transition. Numerical solutions for the maximum single-mode diameter are available for some of these. For others, whether the fiber supports one or more transverse modes at a particular wavelength can be determined experimentally.

Figure 4:
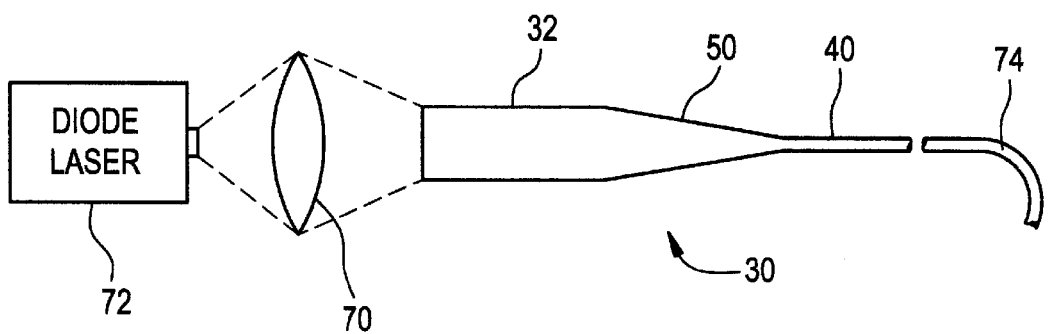
FIG. 4 is a schematic illustration of a pump source utilizing a tapered fiber laser of the present invention.

The tapered fiber laser 30 includes two mirrors 60, 62 defining the input and output ends respectively of the optical cavity. The multi-mode section 32, the tapered section 50, and the single-mode section 40 are all included within the optical cavity. The input mirror 60 is made highly transmissive to an optical pump signal 64 at the pump wavelength $\lambda_P$ and highly reflective at the signal (lasing) wavelength $\lambda_S$ of the output signal 66 while the output mirror 62 is made partially reflective (partially transmissive) at the signal wavelength $\lambda_S$. For fiber lasers, it is possible to use a cleaved output facet as the output mirror. Even its 4% reflectance across an air gap to a butt coupled output fiber 74 of FIG. 4 is sufficient to define the optical cavity. Thereby, the pump signal 64 is efficiently admitted into the optical cavity at the input mirror 60, an optical cavity is defined between the mirrors 60, 62, and some of the standing wave in the optical cavity is allowed to pass through the output mirror 62.

Although interference filters can be used as one or both of the end mirrors 60, 62, Bragg grating reflectors are conventionally written directly onto fibers by UV patterning. If the single-mode section 40 is fusion spliced to the output fiber 74, a low-reflectivity grating or a 4% reflection from a downstream pigtail can provide feedback. Laser efficiency is relatively insensitive to output coupling unless the cavity has high loss. It is further possible to discriminate against the 1030 nm mode by making one of the end reflectors preferentially transmissive to 1030 nm, but such discrimination is not necessary if the fiber length is limited so that insufficient gain exists for lasing at 1030 nm and longer, as has been discussed in the background section for single-mode fiber lasers.

For the preferred ytterbium fiber laser, the signal wavelength $\lambda_P$ equals the 976 nm Yb$^{3+}$ transition. The pump signal may be provided by AlGaAs or InGaAs broad stripes, arrays, or diode bar emitting at a wavelength shorter than 976 nm but within the ytterbium absorption band. The practical pump band extends from 850 to 970 nm with a more preferred range being 910–930 nm and a most preferred range being 915–920 nm. The precise values of these bands and the lasing wavelength may shift by a few nanometers depending upon the dielectric host.

The tapered section 50 acts as a cutoff filter passing the lowest-order mode but blocking any higher-order mode. It is important that the taper angle $\theta_T$ be kept small enough that the lowest-order mode passes through the taper without being mixed into other modes as the mode size shrinks from the size of the multi-mode fiber to the size of the single-mode fiber. This condition is called adiabatic coupling. Thereby, only the fundamental mode is coupled into the single-mode section with minimum loss of power. Also importantly, adequate lowest-order feedback from the output mirror 62 back into the multi-mode section 32 causes the multi-mode section 32 to lase only in the fundamental mode, thus greatly conserving power.

Figure 3:
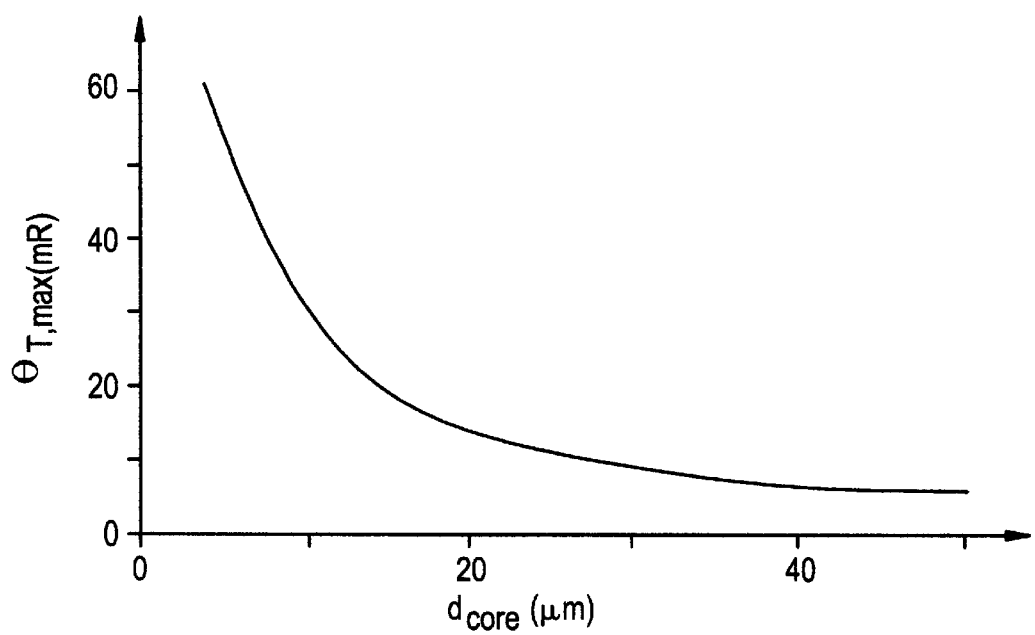
FIG. 3 is a graph depicting the relationship between the core diameter, pre or post tapered, and maximum taper angle allowed without permitting mode mixing.

Tapered optical fibers have previously been proposed to expand the mode field diameter coming from a single-mode fiber. That is, up-tapered fibers are known. These devices have been shown to operate with low loss, that is, with negligible coupling to higher-order modes up to spot sizes of 50 $\mu$m. The V-value at this spot size is approximately 30 for a typical 0.2NA (numerical aperture) fiber, and this V-value corresponds to about 500 guided modes supported in the multi-mode fiber. The limiting factor is mode coupling between the LP$_{01}$ mode and the LP$_{02}$ mode. This coupling can be kept to negligible values provided that the local taper angle $\theta_T(Z)$ be $$\theta_T(z) < \theta_{T,max} = \frac{2\pi a(z)}{\beta_{01} - \beta_{02}} \quad (3)$$

where $\beta_{01}$ and $\beta_{02}$ are the propagation constants of the LP$_{01}$ and LP$_{02}$ modes and a(z) is the local core radius. The propagation constants vary strongly with the core radius resulting in the limiting taper angle $\theta_{T,max}$ in milliradians plotted as a function of core diameter $d_{core}$ in FIG. 3 for a 0.6NA fiber. Clearly, the condition becomes stricter as the fiber diameter increases, but even at 50 $\mu$m, it is still 3.8mR (0.218 degree). The worst condition occurs for the core diameter of the multi-mode section. A constant taper over as short a length $L_T$ as 5 mm will show negligible loss to other modes. A parabolic rather than linear taper produces the shortest adiabatic length.

Minute imperfections in the multi-mode fiber will cause some mode mixing from the fundamental to the higher-order modes. This type of mode mixing can be reduced by heavily doping the fiber with either Yb$^{3+}$ or neodymium (Nd$^{3+}$). In highly doped fibers, $L_{abs} \ll L_{max}$, where Labs is the absorption length (inverse to doping concentration) and $L_{max}$ is the length corresponding to significant mode coupling due to the minute imperfections, the doping or fiber length is chosen such that absorption length nearly equals or is somewhat less than the length of the multi-mode fiber, $L_{abs} \approx L_{MM}$. If the multi-mode fiber were substantially longer, $L_{MM} \gg L_{abs}$, lasing at 1030 nm would be favored, as was previously discussed. A length of no more than several centimeters is possible. An absorption of 15 dB in the multi-mode fiber means that a large fraction of the pump power is absorbed. This amount of absorption corresponds to about five absorption lengths, that is, $L_{MM} \leq 5 L_{abs}$. In practice, we may use a length $L_{MM}$ shorter than $5L_{abs}$, to trade off unabsorbed pump power against threshold.

The illustration implies that the three sections 32, 50, 40 are drawn from a common doped preform. However, different fibers may be spliced together to form the illustrated structure. Because the pump light is mostly absorbed in the multi-mode section 32, only that section needs to be doped to absorb the pump light and provide the excitable states. Indeed, even the multi-mode section 32 can be divided into a doped and an undoped section.

The most likely loss of the lowest-order mode is caused by coupling into higher-order modes at the end of the multi-mode section 32 next to the input mirror 60 as a result of an imperfect end face angle. For a 50m spot size, roughly the core diameter, a tolerance of ±0.23 degree is required to achieve less than 1 dB loss from the lowest-order mode. This tolerance is obtainable by careful cleaving or polishing.

This design allows the major part of the optical gain to be obtained in the wide multi-mode section 32, particularly when the multi-mode length $L_{MM}$ is made longer than the absorption length $L_{abs}$ at the pump wavelength $\lambda_P$, that is, longer than $1/\alpha p$. However, the output of the tapered fiber laser is a single, fundamental mode.

As illustrated in the schematic view of FIG. 4, the similar aspect ratios of the diode laser 72 and of the input of the multi-mode section 32 (both vertically or horizontally aligned alike) allows a lens or fiber-optic coupler, optical exciter, or other beam shaper or focusing element 70 of FIG. 4 to focus the relatively large-size output of a wide stripe or "broad area" laser diode 72 or even a diode bar into the wide multi-mode core of the tapered fiber laser 30. The optical characteristics of a broad stripe laser may be good enough to allow direct coupling into the multi-mode fiber. A single-mode fiber 74 is butt coupled to the output end of the single-mode section 40. If the tapered fiber laser 30 is being used as a pump source for an EDFA or other doped optical amplifier, the single-mode fiber 74 is the pump fiber 20 of FIG. 1.

The inclusion of the multi-mode fiber within the optical cavity avoids the problems of preferential lasing of 1030 nm radiation as discussed above with respect to Equation (1). That is, the fiber has only a single core and cladding and the overlap ratio $\Gamma_S/\Gamma_P$ is close to unity. Almost all the optical gain can be confined to the multi-mode section 32 by requiring its length $L_{MM}$ be greater or at least not substantially less than the absorption length $L_{abs} = 1/\alpha p$. Since the lasing predominantly occurs in the multi-mode fiber, the threshold power for lasing is increased over what it would be for a much smaller single-mode fiber.

Preferably, the core 34 of FIG. 2, for example, is doped with optically excitable ions to form overlap factors $\Gamma_S$ and $\Gamma_P$ of the signal mode and pump mode with the dopant profile such that the overlap ratio $\Gamma_S/\Gamma_P$ is between 0.1 and 10, and more preferably and usable between 0.2 and 5. Such overlap ratios should prevent low area ratio clad-pumping while allowing the dopant to be confined to the multi-mode core 34.

Since almost all of the gain is obtained in the multi-mode fiber, the power threshold for lasing is increased over what it would be for single-mode fiber. The threshold power $P_t$ scales in proportion to the core area and the length of the device. It is well approximated by:

$$P_t = \frac{h\nu}{\sigma_a \tau} \pi a^2 \frac{\alpha P}{4.343} \qquad (4)$$

where $\sigma_a$ is the pump absorption cross section, $\tau$ is the fluorescent lifetime, $\pi a^2$ is the core area, and $\alpha p$ is the pump absorption in dB.

The core area will be dictated by the brightness of the laser diode used as the pump source and the numerical aperture (NA) of a step-index fiber given by:

$$NA = \sqrt{n_{core}^2 - n_{clad}^2} \qquad (5)$$

For simple geometrical imaging of a broad stripe diode facet into the fiber, the product of the stripe width and the diode divergence angle in the plane of the junction sets the limits on the design. For a typical 100 µm broad stripe laser, the parallel divergence angle corresponds to an NA of approximately 0.2. For efficient coupling into a 30 µm multi-mode core, a fiber NA of greater than 0.6 is desired. For a 15 µm core, an NA of 1.3 is needed. These values represent very high contrast between the core and cladding and are higher than available in standard silica fiber. However, they can be achieved with a multi-component core and a silica cladding. Tantalum silicate and lanthanum alumina silicate fibers have been fabricated with a high refractive index relative to silica. Almost any multi-component fiber will give a high refractive index, for example, those based on phosphates, lead silicates, and germanates. However, the chemical and physical properties of the core must be compatible with the cladding. It is known that $Yb^{3+}$ and $Nd^{3+}$ can be doped into glasses other than silica and produce nearly the same transition levels.

The use of beam-shaped laser diodes with reduced asymmetry in their $M^2$ values in the x- and y-directions eases the requirement for high values of NA as will be discussed later.

Assuming a multi-mode core diameter of 30 µm, the threshold power for 10 dB of pump absorption is of the order of 1W. Two polarization multiplexed broad stripe lasers each producing 2W of output power can be coupled into a tapered Yb fiber laser to produce 2.7W of output power at 976 nm using some conventional assumptions.

Figure 5:
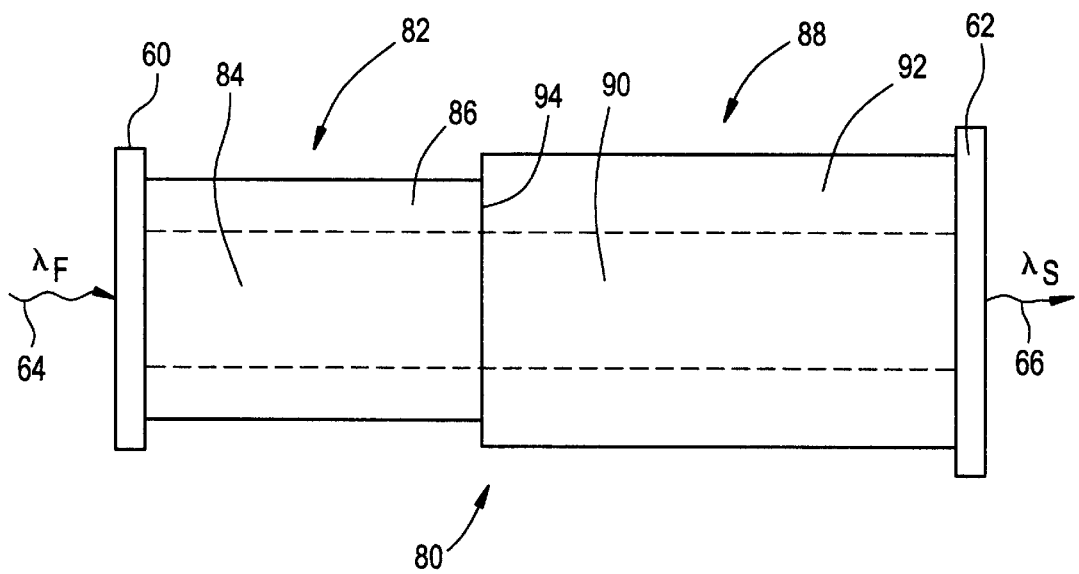
FIG. 5 is a cross-sectional view of an alternate stepped embodiment of the present invention.

A second embodiment of the invention is illustrated in the cross-sectional view in FIG. 5 of a stepped fiber amplifier 80 having a uniform multi-mode fiber 82 with a core 84 and a cladding 86 and a uniform single-mode fiber 88 with a core 90 and cladding 92. The multi-mode fiber 82, similarly to the multi-mode section 32 of FIG. 2, receives the pump light 64 and provides most of the optical amplification. The single-mode fiber 88 is butt coupled at a junction 94 to the multi-mode fiber 82, for example by a splice or other connection, and effectively outputs a lasing signal 66 that is only the fundamental mode. The mode field diameters of the lowest-order modes are matched in the two fibers 82, 88, as is suggested in FIG. 5 by their cores 84, 90 having the same diameter although the mode size depends as well on the refractive indices of the core and cladding. As a result, the multi-mode fiber 82 has a larger contrast between its core 84 and cladding 86 and is thus a high-NA fiber while the single-mode fiber 88 has a lesser contrast between its core 90 and cladding 92 and is thus a low-NA fiber.

Figure 6:
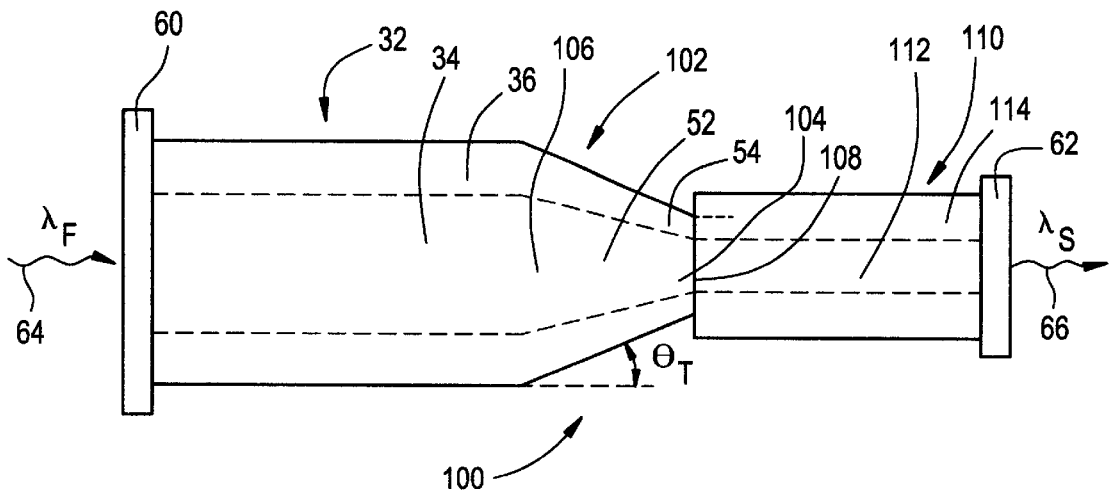
FIG. 6 is a cross-sectional view of an alternate partially tapered embodiment of the present invention.
Figure 7:
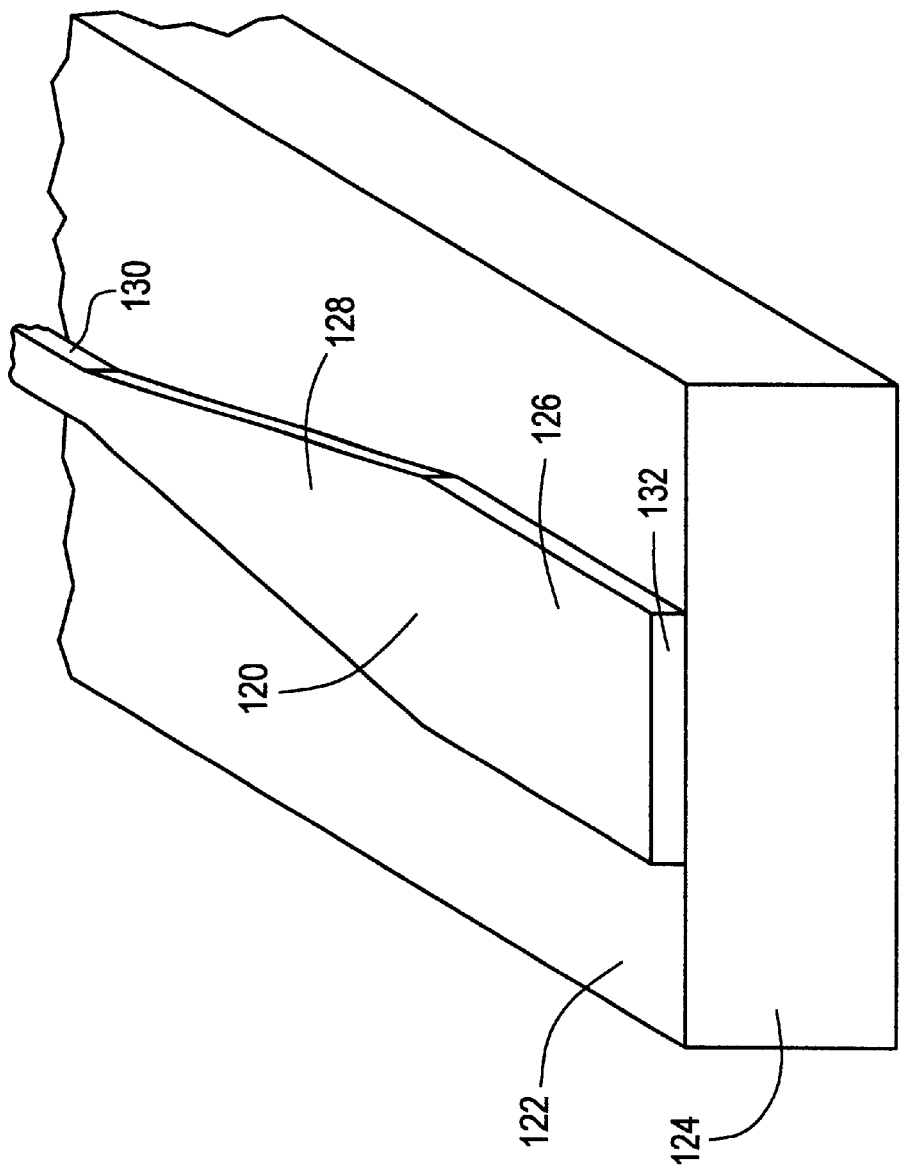
FIG. 7 is a perspective view of an alternate embodiment of the present invention incorporating a planar waveguide formed on a substrate.

The design of the stepped fiber amplifier 80 can be combined with that of the tapered fiber amplifier 30 to form a partially tapered fiber amplifier 100, illustrated in cross section in FIG. 6. It includes the multi-mode section 32 of FIG. 2 and a partially tapered section 102 of construction similar to the tapered section 50 of FIG. 2, but it does not fully taper down to a single-moded end. Instead, its smaller end 104 continues to support multiple modes but fewer modes than its end 106 adjacent to the multi-mode section 32. Its smaller end 104 is butt coupled across a junction 108 to a single-mode fiber 110 having a core 112 and a cladding 114. Similarly to the stepped design of FIG. 5, the mode field diameters for the respective lowest-order modes are matched across the junction 94 between the smaller end 104 of the partially tapered section 102 and the single-mode fiber 110. As a result of the mode-matching requirement, the multi-mode section 32 and the partially tapered section 102 have larger contrast between their respective cores and claddings and thus form a high-NA fiber, while the single-mode fiber 110 has lesser contrast and forms a low-NA fiber.

It is possible to pump directly into a tapered waveguide. However, the taper angle must be further reduced so that the pump light does not leak out of the tapered waveguide. It is generally preferred to not begin tapering until a significant fraction of the pump light is absorbed.

Cylindrical fibers are only one example of dielectric waveguides. Fiber can be drawn into other shapes, for example, ellipses or rectangles. Furthermore, rectangular dielectric waveguides can be formed on planar substrates by techniques similar to those used in semiconductor fabrication or other techniques, such as ion-exchange, sputtering, plasma enhanced chemical vapor deposition, flame hydrolysis, and $LiNbO_3$ technology including diffusion doping. A simple example of such a planar waveguide is illustrated schematically in the orthographic view of FIG. 7. A rib waveguide 120 is formed on the top surface 122 of a dielectric substrate 124 having a lower refractive index than that of the rib waveguide 120. A separate unillustrated upper cladding may be formed over the rib waveguide 120 or air can serve as the upper cladding. The rib waveguide 120 includes a rectangular doped multi-mode section 126, a rectangular tapered section 128, and a nearly square single-mode section 130. Other forms of planar waveguides are possible, including those tapered in two dimensions and those having a stepped transition between the multi-mode and single-mode sections. The formation of a rectangular waveguide on a planar substrate is additionally advantageous because it allows the integration of the laser diode on the same substrate. Similar structures can be drawn from a preform.

The rectangular cross section of the multi-mode section 126 is particularly advantageous because its entrance face 132 can be more easily matched to the emission pattern of a wide stripe laser, which may have a height-to-width aspect ratio (AR) of 1:100. That is, the width of the entrance face 132 can be made substantially greater than its height, which will be defined as a low aspect ratio. Further, the height can be made to correspond to a single mode, thus eliminating the need for vertical tapering. The light emission from a broad stripe laser may be considered as an image being focused on the waveguide face 132. The image of a broad stripe diode laser is substantially wider in the plane of the diode chip than it is in the vertical direction, for example, tens of microns versus a few microns. Thereby, nearly all of the laser diode power can be easily coupled into the waveguide while maintaining a high optical pump power density. The high power density allows a lower power threshold for lasing than that available in circular or square waveguides.

Figure 8:
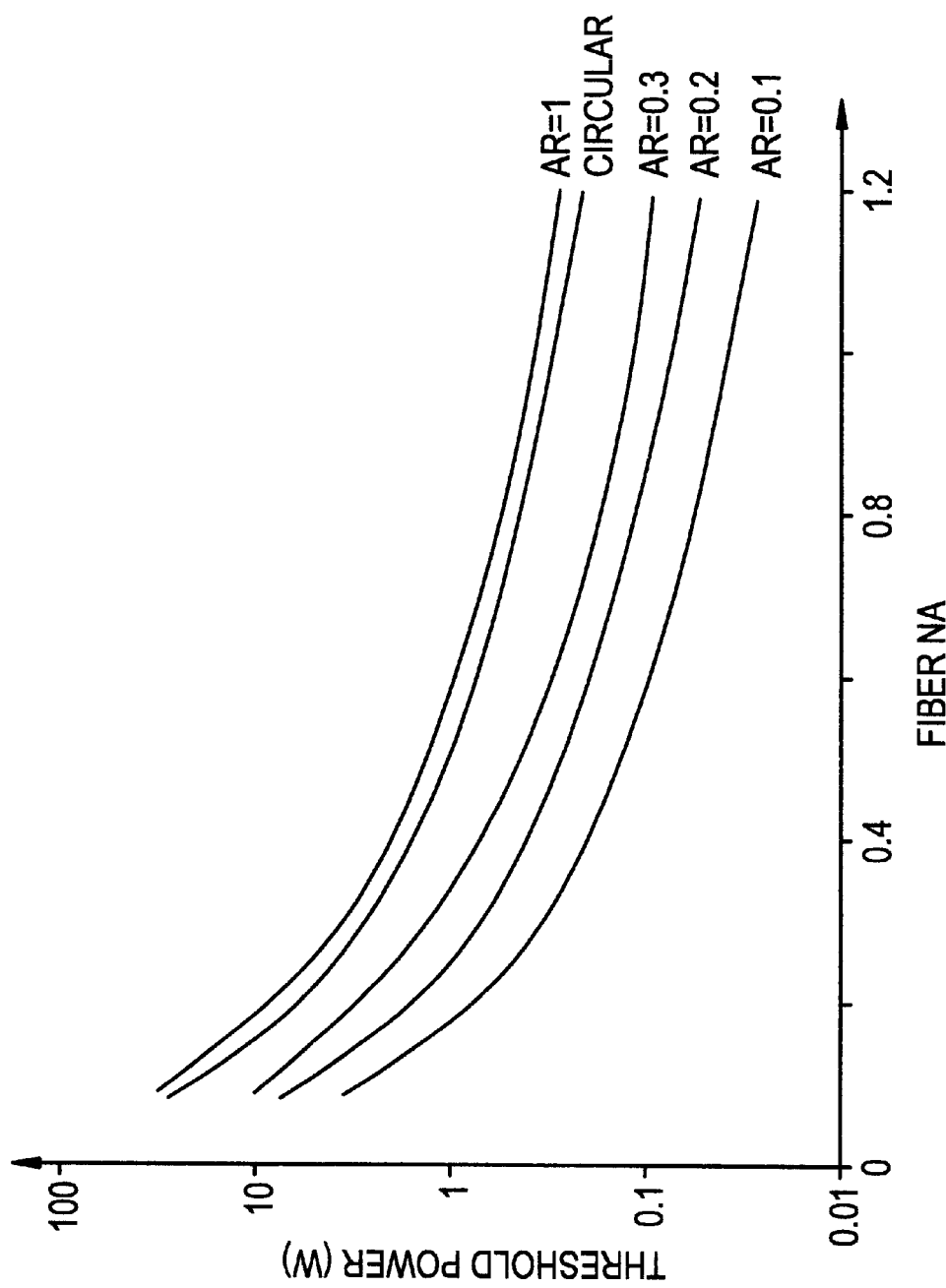
FIG. 8 is a graph of lasing threshold power for a number of waveguides having differing aspect ratios as a function of their numerical aperture.

The threshold powers for various waveguides have been calculated as a function of the numerical aperture of the waveguide. In the example plotted in FIG. 8, the waveguide has a value of 20 µm for the product of the length of the major axis and the numerical aperture, for example, an NA of 0.2 and a major axis of length 100 µm. The top curve is calculated for a square multi-mode waveguide having a value of unity for the aspect ratio AR of the height to the width. The next lower curve is for a circular multi-mode waveguide. As the aspect ratio of the rectangular multi-mode waveguide drops, the threshold power is significantly decreased. For rectangular aspect ratios of less than π/4 or 0.785, the rectangular multi-mode waveguide has a smaller threshold power than a circular one For example, for a waveguide with a numerical aperture of 0.6, the threshold power is reduced from 900mW for a circular 33 µm fiber to 200mW for a rectangular waveguide having an aspect ratio of 0.3 (33 µm×11 µm). These dimensions are consistent with image sizes of broad stripe diode lasers. This reduction in threshold power is greatly advantageous if a 1W diode is the limit of commonly available broad stripe pump sources.

The inventive concepts presented above for cylindrical fibers can be applied as well to these other dielectric waveguides, that is, the waveguide being multi-moded on the pump end and single-moded on the output end and the various ways of achieving the transition in the two geometries.

Although the invention is developed in view of $Yb^{3+}$ doping, it is not so limited. The tapered fiber laser may be doped with other transitional or rare-earth ions, such as $Nd^{3+}$. A combination of Yb and Nd doping, either by co-doping or by a sequence of differently doped fibers allows pumping at 800 nm rather than 920 nm.

The invention has been described in terms of a fiber-based oscillator, however the invention is generally applicable to any multi-mode waveguide oscillator incorporating a transverse mode-selection filter as described and claimed herein.

Referring to FIGS. 9–14, a modification of Corning Inc.'s multi-clad™ coupler technology is used to form a taper 30 or an asymmetric coupler 400 as a mode transformer 300 by using tapering and core-diffusion for maximizing pump brightness in a brightness converter. Since the basic difference between a single-mode fiber and a multi-mode fiber is their core diameter size difference, the mode transformer 300 basically transitions itself from a larger core diameter to a smaller core diameter to match multi-mode to single-mode.

In one embodiment of the invention, a rectangular input core 342 is employed to reduce the active area of the doped core without compromising the coupling efficiency between the pump diode 72 and a multi-mode fiber 740 to match the elliptically-shaped pump radiation or emission. Other input core cross-sections of other shapes, for example, elliptical or any other matching-beam shape, can be used to match the shape of the pump emission area. However, it is desirable for the output of the fiber laser to have a substantially circular mode field as its output cross-section or core diameter 340. It is desirable for the output of the fiber laser to have a substantially circular mode field because a conventional fiber has a circular mode field and the better the mode field size and shape match, the lower the coupling loss. Even though the core 34 can be of other shapes, the rectangular aspect is preferred for this fiber laser application since the pump laser diode 72 also has a rectangular beam.

A novel technique has been developed where the aspect ratio of the rectangle can be reduced by a dissolution and expansion process during tapering to form a mode transformer or optical transitioner 300 for transitioning multi-mode to single-mode. For example, if the multi-mode fiber 740 is made by the technique described in the pending patent application Ser. No. 09/103,655, entitled "Composition for Optical Waveguide Article and Method for Making Continuous Clad Filament" (now U.S. Pat. No. 6,128,430) or in the provisional patent application No. 60/097,876, entitled "Methods and Apparatus for Producing Optical Fiber," both by Chu et al. and assigned to the same assignee, a soft multi-component core glass 34 is surrounded by a silica cladding 36 by drawing the cladding tube filled with molten core cullets, filaments, rods or other shaped core material. The core material is placed within the cladding tube which has a lower refractive index than the core's refractive index. Optionally, as seen in FIGS. 12 and 13, for extra stability or for further aspect ratio control, an overclad tube, cane, sleeve, or jacket 360 made of the same cladding material as the first cladding tube or some other composition such that the overclad has a refractive index the same as the first cladding tube or lower to control the numerical aperture of the transformed fiber by building up more cladding material around the aperture or reduce the aperture, respectively. An exemplary composition of the overclad tube 360 is boron doped silica.

The core glass is selected to melt at or below the softening point of the cladding tube and that the thermal expansion difference between the core and clad not be so large as to shatter the resultant fiber upon cooling. Hence, a difference in the softening point of the core and the softening point of the cladding is preferably at least 100 degrees Celsius. Furthermore, it is preferred that the core exhibit a viscosity of less than $10^4$ poise at a temperature at which the cladding exhibits a viscosity of $10^{7.6}$ poise.

Since the core glass 34 is selected to be of a different material such that it is much softer than the pure silica cladding 36, the core glass 34 will be very fluid and conform to the geometry dictated by or conform to the cladding 36 when heated to the temperatures required to draw fiber and, according to the teachings of the present invention, to taper the resulting fiber 40. The shape of the core does not matter, it is more the inventive concept that the NA can be dropped and the shape can be made more circular with these soft glass cores. The fluid core 34 will begin to dissolve the silica clad 36, lowering the refractive index of the core 34 and providing a better NA match to standard single-mode fibers 20 on the output end of the taper 340.

Any time two dissimilar materials are placed in contact, there will be a driving force (created by the chemical potential difference between the two materials) for mixing. The speed at which the mixing will occur will depend on the diffusion coefficients of the migrating species and the viscosity of the glass. The more fluid the glass or more mobile the species, the faster the mixing will occur. In this inventive case, the core glass is quite fluid (viscosity<100 Poise) during the taper 48 or coupler 400 (see FIG. 11) draw. The core glass begins to dissolve the silica clad, just as hot water will dissolve sugar faster than cold water, and ice will not dissolve sugar much at all (at least not in normal time scales) since the ice is now a solid and the diffusion coefficients are not very high.

If the core is rectangular, the dissolution rate is faster in the direction of the minor axis due to mass transport constraints along the major axis. The core 34 can be initially made rectangular by starting with a cladding tube having a rectangular channel, groove, or other shaped aperture, inside the tube for depositing core cullets within, as described in 60/097,876 or in a co-pending patent application (D14631) assigned to the same assignee, Ser. No. 09/377,926 entitled "Method for Making Fibers Having Cores with Non-Circular Cross-Sections, Fibers, Fiber Lasers and Amplifiers Formed Thereby, and Systems Incorporating Such Fibers as Brightness Converters" filed on the same date as the present invention and incorporated herein by reference.

Because the core is much softer than the cladding, the core will become a liquid during the tapering process in between sealed ends of the fiber. The thermal expansion of a liquid glass is two to three times that of a solid glass, causing the core to become pressurized. The hydrostatic pressure in the core will exert a force proportional to the area on which it acts. Hence the larger sides of a rectangular or elliptical core will experience a greater outward force pushing the sides into a more circular output cross-section. Referring additionally to FIGS. 12 and 13, the aspect ratio of a mode transforming taper 48 can be reduced, in accordance with the teachings of the present invention, from the larger rectangular input cross-section 342 to the smaller circular output section 340, as the neckdown region 102 is drawn and the aspect ratio and NA of the core are both reduced by core diffusion/dissolution and expansion. More specifically, the taper or neckdown region 102 is made by heating a section of the fiber 740 and pulling under tension like pulling taffy. The tension is provided by an outer tube or sleeve (housing or preform) 360 through which the rectangular core fiber 36 was originally inserted through so that it now surrounds and changes shape as the fiber 36 is heated and drawn to the desired configuration. Preferably, the material of the overclad tube or housing is made from the same or similar cladding material, such as boron doped silica.

In yet another embodiment, a much stiffer overclad tube could be used to enhance diffusion and dissolution in a fiber with substantially matched core and clad softening points. Thus, at the high temperature required to draw the overclad tube, the viscosity of the core and clad would be reduced, and the diffusion/dissolution maximized to reduce the output aspect ratio and NA of the core material.

The minimization of surface energy will also drive the rectangular core 342 towards a circular cross section 340. Thus an initially rectangular multi-mode waveguide 740 can be transformed by tapering to a single-mode or a few-mode waveguide 40 of substantially circular geometry and with a reduced NA. This method has been successfully employed in transforming a 30×10 micron rectangular core glass 34 of a multi-component silicate glass at the multi-mode rectangular input to an output mode closely matched to a CS980 single-mode fiber 20. Preferably, the multi-component silicate glass is $60SiO_2$ $28Al_2O_3$ $12 La_2O_3$ (in mole %). Even though other single-mode fibers are usable, the single-mode fiber 20 is the CS980 single-mode fiber made by Corning, Inc. for propagating wavelengths at 980 nm and having a standard 125 micron diameter for the overall fiber. A loss of less than 0.5 dB has been achieved with this mode transformer 48 mode-matched to the CS980 fiber 20.

Since the core is molten and the cladding is softening, diffusional processes are relatively fast, so graded index profiles can be created in situ. With appropriate choices of cladding material, the transformed fibers produced can be fusion spliced to conventional fibers making the transformed fibers quite practical in existing fiber networks and easing device manufacturing.

The refractive index versus radial distance graph of FIG. 14 shows how the peak index and effective graded NA can be decreased by drawing or tapering the core 34 from 18 to 5 microns. Further reduction in NA and increased circularity is achieved with more tapering or decreased core dimensions.

Figure 11:
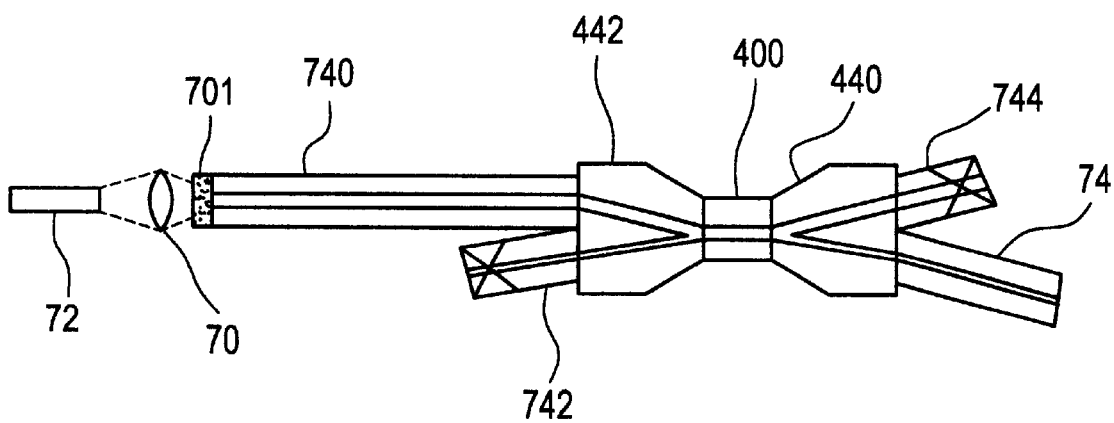
FIG. 11 is a schematic representation of a coupler 400 used as the mode transformer 300 of FIG. 9 according to the present invention.

Referring to FIG. 11, a further embodiment of the present invention is shown. A four port fused taper asymmetric coupler 400 is used as the mode transformer 300 for mode transformation. A 4-port asymmetric coupler 400 (one arm 442 being multi-mode and the other arm 440 being single-mode) can replace the tapered section 30, as the mode transformer 300, in accordance with the present invention. In this instance tapering at both the multi-mode arm and the single-mode arm, each having one unused port, results in an equalization of propagation constants between the CS980 single-mode fiber 74 and a low-order mode of the tapered multi-mode fiber 442. This coupler differs from prior-art couplers because it is highly asymmetric and takes advantage of the decreased NA and reduced aspect ratio that occurs when tapering "soft core" fibers.

The asymmetric coupler 400 couples the fundamental mode of the single mode fiber to one mode of the multi-mode fiber, ideally the lowest order mode. The order of the mode to which the CS980 LP01 mode of the single-mode fiber 74 couples is dependent on the taper ratio and the core-diffusion rate in the multi-mode fiber 442. A greater than 20 dB power exchange to the LP02 mode with an excess loss below 0.5 dB has been measured with this asymmetric coupler arrangement. In this example efficient operation requires that the LP02 mode suffers minimal mode conversion in the rectangular up-taper 440, in the straight multi-mode fiber section 740, and at the input mirror 701.

The method to make the asymmetric coupler 400, as a fused taper coupler, is similar to the core diffusion and elongation process to make the tapered mode transformer 30. However, instead of using one multi-mode fiber 740 as the only material to be inserted through the outer cladding or housing 360, a single-mode fiber 742 is also inserted through the outer cladding 360 before heat is used to draw and diffuse the two separate multi-mode and single-mode fibers 740 and 742, respectively, into the desired tapered multi-mode arm 442. The other end of the multi-mode fiber 740 is unterminated to form the multi-mold fiber end 744 and tapered and fused along with the other end 74 of the single-mode fiber 742 through the same outer cladding 360 to form the single-mode arm 440. The cladding 360 can be a boron or fluorine doped capillary or overcladding-tube or jacket 360 to hold the two inserted fibers, one single-mode and one multi-mode, in place and to build-up the cladding material, if necessary. The tube 360 could be doped with other dopants as long as the tube 360 has a lower index than both claddings of the two fibers. The cladding tube 360 with the inserted fibers 74 and 744 are heated together and pulled at both ends to produce two tapered arms 442 and 440, similar to the process used in making couplers as shown in U.S. Pat. No. 4,902,324, assigned to the same assignee. Instead of having both fibers in a standard coupler made from single-mode fibers, the asymmetric coupler 400 couples one and only one mode of the multi-mode fiber 740 into a single-mode fiber 74. By the same diffusive and dissolution process, the resultant tapered coupler 400 will have matched propagation constants between the tapered CS980 single-mode fiber 74 and one of the modes of the tapered multi-mode at the single-mode port of the single-mode arm 440 formed from the diffusion of the multi-mode fiber 740.

When the core and the clad of each of the two fibers 74 and 740 of FIG. 11 are placed side-by-side, the fibers tend to cross-diffuse or dissolve to transform a rectangular core into a circular output, according to the present invention. Different thermal characteristics of core and clad glass lead to an interdiffusion during heating to force the diffusion to occur in the mm fiber so that the multiclad coupler would result to transition the multi-mode to single-mode.

Referring to FIGS. 15–18, various implementation of the lens, power coupler, optical exciter or lensed-tapered fiber optics coupler 70 can be used as broad-area laser diode beam-shapers. As illustrated, several embodiments of anamorphic (circularly nonsymmetric) coupling optics beam shapers preferably provide the optimum power coupling for the tapered fiber laser 30. In accordance with the teachings of the present invention, techniques have been developed that enable efficient coupling of pump power from broad-area laser diodes having typical emitting apertures with dimensions of 100×1 $\mu m^2$ and NA's of 0.1/0.6 in the slow and fast axes, respectively, into a fiber with a rectangular core cross section of 30×10 $\mu m^2$ and effective numerical aperture of >0.42. The terms "slow" and "fast" refer to the planes that are "parallel" and "perpendicular," respectively, to the laser diode junction plane. The laser diode etendu is 100×1×π0.6 0.1=18.8 $\mu m^2$ sr, and the fiber output etendu is greater by an order of magnitude. Mathmaticallywise, etendu is given by the product of the emitter area and the emitter solid angle. SR is ster-radian and is a unit of solid angle. According to a fundamental principle of optics, the etendu of a source or emitter can not decrease upon propagation or manipulation by optical components such as a beam shaper. The design goal of a beam shaper is to maintain the etendu of a given laser diode beam as small as possible at the input facet of a receiving optical fiber; preferably, the receiving fiber has an etendu comparable in magnitude to that of the shaped beam.

Figure 15:
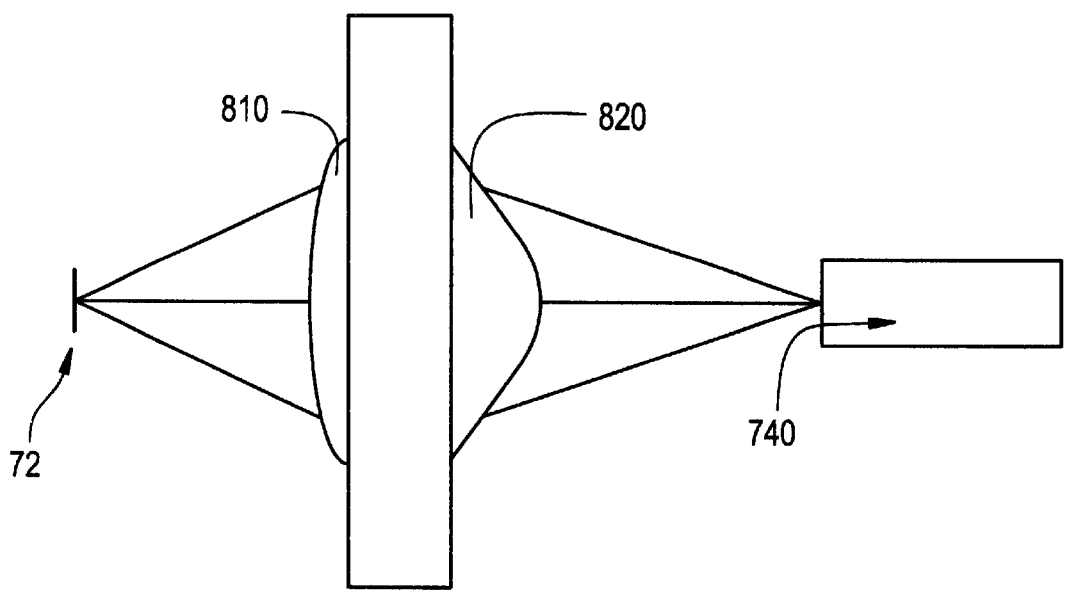
FIG. 15 is a side view of a monolithic power coupler embodiment of the optical exciter 70 of FIG. 9, according to the present invention.
Figure 16:
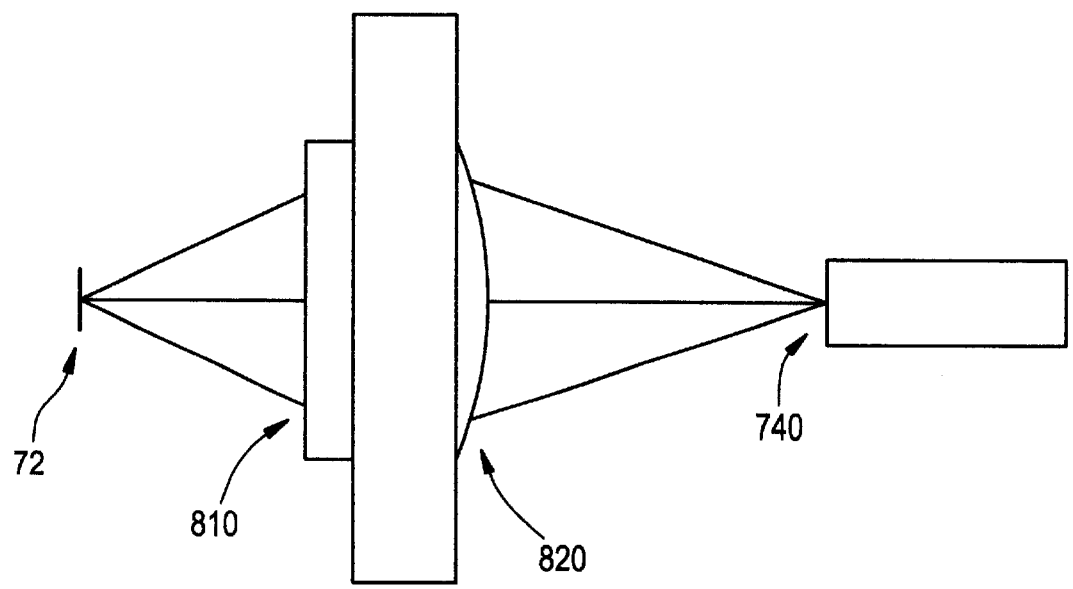
FIG. 16 is a top view of the monolithic power coupler embodiment of the optical exciter 70 of FIG. 9, according to the present invention.

Referring to FIGS. 15 and 16, a single-element (2 surfaces) monolithic micro-optics power coupler 801 is illustrated as one embodiment of the optical exciter or lensed-tapered fiber optics coupler 70. In order to efficiently couple light from the broad-area semiconductor laser 72 with emitter dimensions of 100×1 $\mu m^2$ and NA's of 0.1/0.6 in the slow and fast axes (measured at 5% of the maximum far-field intensity points), respectively, a monolithic anamorphic micro-lens consisting of only two surfaces is made on fused silica; these two surfaces together produce an image of the emitter near field with dimensions of 30×10 $\mu m^2$ and 5% NA's of 0.35/0.12 in the slow and fast axes, respectively. Referring to FIG. 16 or looking from the top, the first surface includes a cylinder with a non-circular cross sectional sideview 810 which collimates the fast axis. The second surface includes a toroidal surface structure 820 which focuses the collimated fast axis with magnification greater than times five (×5) and images the slow axis near field with demagnification of ×3.3. For the fiber laser to work optimally, this micro-power coupler 801 requires an alignment of twelve degrees of freedom with translational tolerances of 1–2 $\mu m$ and angular tolerances of 0.5°. The shape of the cylinder 810 and toroid 820 is structured to minimize mis-alignment errors that could occur during the process of coupling light from the broad-area emitter into the fiber core. The coupling efficiency of this monolithic power coupler 801 is in the range between 75% to 90%. Typical dimension of the power coupler clear aperture, where the light is coupled through, is in the range of 100 to 300 $\mu m$. The power coupler has a total conjugate distance of about 1 mm, with front and back working distances of 30–60 $\mu m$ and 100–200 $\mu m$, respectively.

Figure 17A:
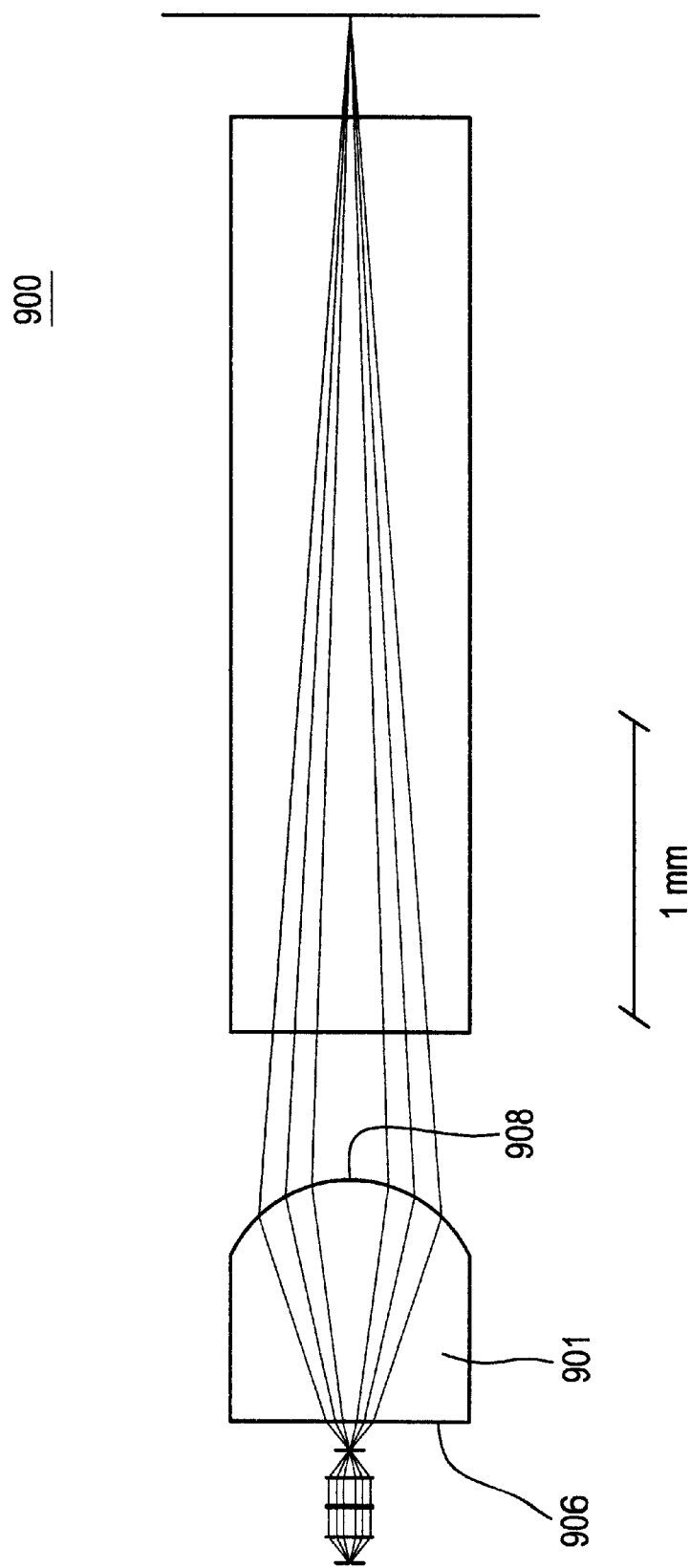
FIG. 17A is a side view of a crossed-cylinder power coupler embodiment of the optical exciter 70 of FIG. 9, according to the present invention.
Figure 17B:
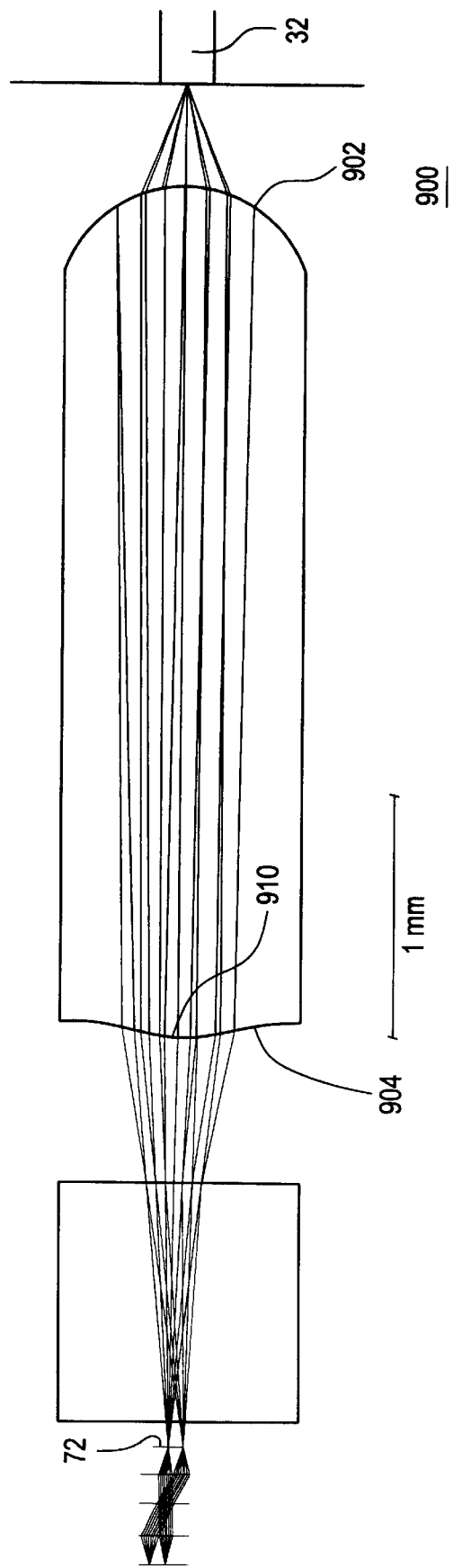
FIG. 17B is a top view of the crossed-cylinder power coupler embodiment of the optical exciter 70 of FIG. 9 and of FIG. 17A, according to the present invention.
Figure 17C:
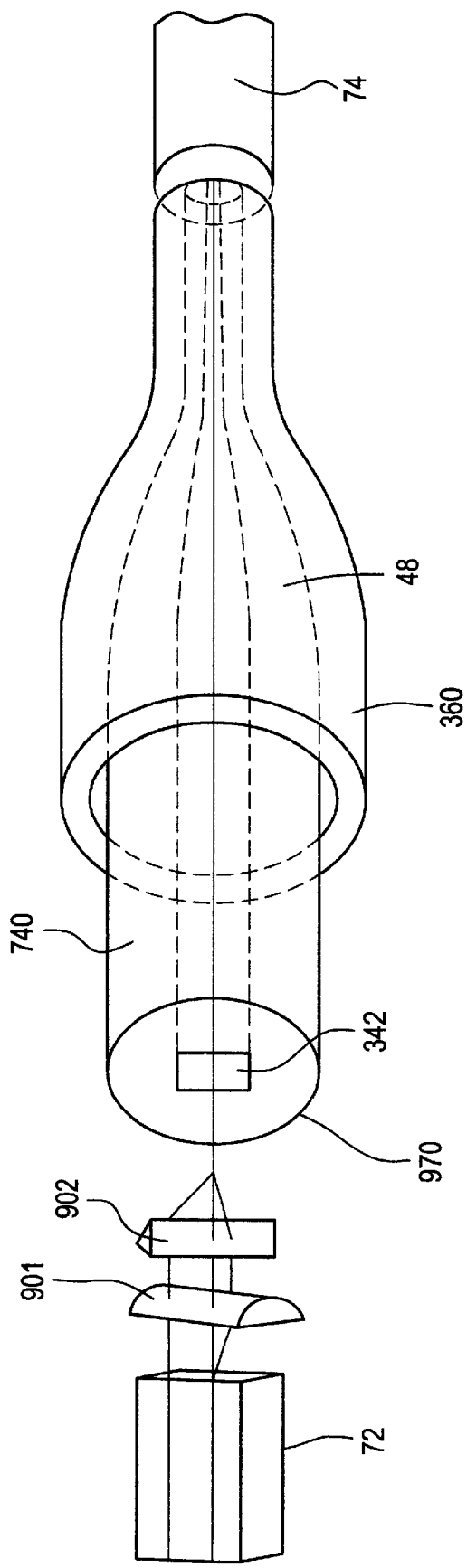
FIG. 17C is a perspective representation of the crossed-cylinder power coupler embodiment of the optical exciter 70 of FIG. 9 and of FIG. 17A, used with the mode converter 30 of FIG. 13, according to the present invention.

Referring to FIGS. 17A, 17B, and 17C, slightly larger than the micro-optics lens 801, but having a similar outside surface when assembled as one piece, a second embodiment of the lens or power coupler 70 is represented as a two-element (4 surfaces 906, 908, 910, and 912) mini-optics power coupler 900 for power coupling light into the input facet of the multi-mode fiber 32. This lens or power coupler 900 is formed from two crossed cylinders 901 and 902, made of a suitable glass material, with finite-conjugate imaging planes in each axis. The first optical coupling element 901 has first 906 and second 908 surfaces with cylindrical symmetry and a first axis of symmetry parallel to the slow axis of the multi-mode laser source 72. The second optical coupling element 902 has third 910 and fourth 912 surfaces with cylindrical symmetry and a second axis of symmetry parallel to the fast axis of the multi-mode laser source 72, wherein the first and second optical coupling elements are crossed such that the first axis of symmetry of the first element 901 is oriented at right angles to the second axis of symmetry of the second element 902.

As with other embodiments of the power coupler, the numerical aperture (or acceptance angle) of the power coupler in both orthogonal axes is larger than the numerical aperture (or divergence angle) of the output facet of the multi-mode laser source 72.

Referring to FIG. 17A or looking from the side, a fast axis non-circular lens 901 with about ×5 to ×10 magnification followed by a slow axis telescope 902 with ×3.3 demagnification, bonded and optically aligned. This lens system produces an image of the emitter nearfield with dimensions of 30×10 $\mu m^2$ and 5% NA's of 0.35/0.12 in the slow and fast axes, respectively. When coupled into a fiber with core dimensions of 30×10 $\mu m^2$ and NA≈0.42, the etendu at the fiber output is 166 $\mu m^2$ sr. This mini-lens system preferably requires an alignment of eighteen degrees of freedom with translational tolerances of about 1 $\mu m$ and angular tolerances of about 0.1 degrees. The coupling efficiency of this coupler lens is in the range of 75% to 90%. Typical dimension of the lens system aperture 904 is in the range between 0.5 to 2 mm. The power coupler has a total conjugate distance of about 2–5 mm, with front and back working distances of 100–150 $\mu m$ and 150–350 $\mu m$, respectively.

Referring to FIGS. 18 and 19, a third embodiment of lens 70 is represented as a wedged/tapered fiber optics coupler 970 having two surfaces 942 and 342. Instead of being separate pieces, such as the mini and micro-optic lens 900 and 801, the wedged/tapered coupler 970 can be a separate piece or made continuous with the multi-mode fiber 740. To form the coupler wedge or tapered fiber optics coupler 970, a fiber with typical core dimensions of 120×40 $\mu m^2$ and a core effective NA>0.4 is down-tapered with a ratio of 4:1 to a 30×10 $\mu m^2$ core 342 from a much larger core at the input 942 and fabricated from a similar method as the tapering process used in forming the tapered mode transformer 48.

In order to avoid a loss penalty, an optional 20–30° lens-wedge segment 181 is polished on the input core facet 942 of the coupler wedge 970. The optional lens-wedge 181 reduces the launched numerical aperture of the laser diode beam into the fiber core 342, which allows the coupler-wedge 970 to butt-couple the multi-mode fiber 740 of the fiber laser such that the broad-area laser diode power has a launch NA in the range 0.1 to 0.2. The optional lens-wedge 181 allows a taper ratio in the range 4:1 to 2:1 of the mode transformer 48 without loss.

Enabling larger taper ratios of the tapered fiber optics coupler 970, without incurring a loss penalty, would require replacing the lens-wedge 181 as an input lens by an anamorphic lens profile 948 exemplified by various embodiments of FIGS. 22 and 23. In FIGS. 18 and 19, the input lens comprises a wedge-shaped microlens 181 on the input core end of the fiber, the wedge-shaped microlens including a first pair of surfaces that intersect at a line that substantially bisect the input core 942. The wedge-shaped microlens includes a pointed fiber endface with an apex on the axis of the adiabatically tapered optical fiber coupler 970. Instead of the planar surfaces of the wedge lens 181 of FIGS. 18 and 19, the lens profile 948 can be circular, have conic surfaces or surfaces of other shapes. In FIG. 20, microlens 948A is formed from a double-wedge-shaped lens profile having a steep angle 949 at a first radius and a shallow angle 950 at a second radius smaller than the first radius. In FIG. 21, microlens 948B comprises a multiple-wedge-shaped lens profile having a plurality of changing angles to approach a continuous surface, such as an ellipsoid. The method for making a lens profile 948 is taught in U.S. Pat. No. 5,455,879, assigned to the same assignee and incorporated herein. The number of degrees of freedom for alignment is minimized using the anamorphic lens profile 948.

The coupler-wedge or tapered fiber optics coupler 970 is made similarly to the taper mode transformer 48, except that the temperature and pressure is controlled in such a way to minimize the diffusion, since the coupler-wedge 970 is designed to maintain its multi-mode characteristics and its rectangular shape at both input 942 and output 342. Hence, the same aspect ratio, or about the same, is preferably maintained both at the input and the output. Thus, a larger rectangular cross-section core would be at the input 942 while a smaller rectangular cross section core would be at the output 342 of the coupler wedge 970. The overcladding 960 similarly builds-up the coupler-wedge 970 such that the desired aspect ratios can be formed.

As fibers with very large numerical aperture (NA) and no diffusion are developed, the technique of using a wedge-coupler 970 allows a fiber beam shaper to be formed that has a brightness comparable to the laser diode (LD) brightness. As is known, brightness is defined as the ratio of optical power in Watts per unit of Etendu. Consider, for example, a circular core step-index fiber with NA=1; an input core with a diameter of 110 $\mu$m can be tapered to an output core with a diameter of 2.8 $\mu$m with no loss provided that the launch NA in both planes is 0.025. Such a launch NA can not be achieved with the simple wedge lens 181 since the 20–30 degree wedge could only produce launch NA's of about 0.1 with its planar surfaces. Instead an anamorphic lens profile 948 is formed on the fiber facet 942, as the optional lens-wedge 181 or is placed immediately, or otherwise coupled, in front of the wedge coupler 970, as seen in FIG. 21 having more angular or curved surfaces. The resultant etendu is about 20 $\mu m^2$ sr at the fiber output, nearly equal to the LD etendu. In another case, the fiber is tapered to an output core of only 8.8 $\mu$m diameter which preferably uses a wedge-coupler 970 in the fast axis to decrease the 0.6 laser diode NA to a launch NA=0.08. As a result, the fiber output etendu is 190 $\mu m^2$ sr.

As another example, a simple wedge 181 produces a launch NA=0.2. The receiving multi-mode fiber (30×10 sq. micron) 740 has an NA=0.6. This means that a taper ratio 3:1 in the wedge coupler 970 can exist and still have no loss to radiation modes. Thus an input core 942 with 100×30 sq. micron can be reduced in the wedge coupler 970 through the taper ratio to an output core 342 of 33×10 sq. micron. For a taper 1 cm long in the wedge coupler 970, the angle of the lens wedge 181 is (100−33)/10000=6 milli-radian, assuming a linear taper.

Theoretically, the wedge angle is chosen by a complicated formula that gives for each ray of the input cone of light the launched NA into the coupling taper 970 as a function of wedge angle. The launched NA is given by:

$$NA_{launch} = n \, Sin[ArcSin[Sin[t+a \, Pi/180]/n]-a \, Pi/180] \quad (6)$$

where n is the index of the coupling wedge glass 970, a is the wedge angle in degrees (measured with respect to the normal to the optical axis) and t is the angle that the input ray makes with the optical axis.

Because the wedge 181 also deviates the axial ray, the wedge angle is selected where the marginal and the axial ray curves intersect. This is about 22 degrees and thus provides that NAlaunch=0.2. Hence, the power coupler satisfies a desired condition where a lensed and/or a tapered fiber optics coupler embodiment, and other variations in between, has a taper ratio for exciting the tapered and core-diffused fiber segment or mode transformer, and has a launch numerical aperture equal to or less than the numerical aperture of the multi-mode fiber divided by the taper ratio of the lensed-tapered fiber optics coupler.

It will be apparent to those skilled in the art that various modifications and variations to the lens, coupling scheme, fiber laser, and other components of the optical package can be made to the present invention without departing from the spirit and scope of the invention. Thus, it is intended that the present invention covers the modifications and variations of this invention provided they come within the scope of the appended claims and their equivalents.

What is claimed is:

1. An optically-active fiber comprising:
   a core doped with an ion optically excitable and having a three-level optical transition when pumped at a first end of an optical cavity by a multi-mode pump source at a pump wavelength for lasing at a signal wavelength different than the pump wavelength at a second end of the optical cavity, said core having a refractive index, wherein said core is tapered from the first end to the second end thereof such that the optically-active fiber is multi-moded at said pump wavelength proximate to said first end, and is single-moded at said signal wavelength proximate to said second end; and
   a cladding surrounding said core and having a lower refractive index than said refractive index of said core.

2. The optically-active fiber of claim 1 wherein the core is adiabatically tapered between the first end and the second end thereof to prevent mixing of a lowest-order mode of the optically-active fiber with one or more higher-order modes thereof.

3. The optically-active fiber of claim 1 wherein the ion produces a three-level lasing system.

4. The optically-active fiber of claim 3 wherein the ion is selected from a group consisting of ytterbium or neodymium.

5. An optical fiber microlens comprising:
   an optical fiber having a core doped with an ion optically excitable and having a three-level optical transition when pumped at a first end by a multi-mode pump source at a pump wavelength for lasing at a signal wavelength at a second end wherein the core is mode transformed from the first end to the second end thereof such that the optically-active fiber is multi-moded at the pump wavelength proximate to said first end, and is single-moded at the signal wavelength proximate to the second end, and a cladding, a longitudinal fiber axis extending through the core, the cross-section of the core in a plane perpendicular to the axis being a rectangle having a major and a minor axis;
   a wedge-shaped microlens on one end of the fiber, the microlens including surfaces that intersect at a line that substantially bisect the fiber core and lies on the major axis.

6. An optically-active fiber comprising:
   a core doped with an ion optically excitable and having an optical transition at a signal wavelength, said core having a refractive index, wherein said core is tapered from a first end to a second end thereof such that the optically active fiber is multi-moded at said signal wavelength proximate to said first end, is single-moded at said signal wavelength proximate to said second end, and has overlap factors $\Gamma_S$ and $\Gamma_P$ of the signal mode and pump mode such that the overlap ratio $\Gamma_S/\Gamma_P$ is between 0.1 and 10; and a cladding surrounding said core and having a lower refractive index than said refractive index of said core.

7. An optically-active fiber comprising:

a core doped with an ion optically excitable and having an optical transition at a signal wavelength, said core having a refractive index, wherein said core is tapered from a first end to a second end thereof such that the optically-active fiber is multi-moded at said signal wavelength proximate to said first end, is single-moded at said signal wavelength proximate to said second end, and has overlap factors $\Gamma_S$ and $\Gamma_P$ of the signal mode and pump mode with the dopant profile such that the overlap ratio $\Gamma_S/\Gamma_P$ is between 0.2 and 5; and a cladding surrounding said core and having a lower refractive index than said refractive index of said core.

* * * * *